(12) United States Patent
Tanaka et al.

(10) Patent No.: US 7,161,800 B2
(45) Date of Patent: Jan. 9, 2007

(54) ELECTRONIC APPARATUS AND UNIT MOUNTING MECHANISM

(75) Inventors: Wataru Tanaka, Kawasaki (JP); Takashi Iijima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/182,001

(22) Filed: Jul. 15, 2005

(65) Prior Publication Data
US 2005/0248915 A1    Nov. 10, 2005

Related U.S. Application Data

(63) Continuation of application No. pct/jp2003/005882, filed on May 12, 2003.

(51) Int. Cl.
*G06F 1/16* (2006.01)
(52) U.S. Cl. ............... 361/683; 312/223.1; 312/223.2
(58) Field of Classification Search ................. 361/683
See application file for complete search history.

(56) References Cited

U.S. PATENT DOCUMENTS

| | | | | |
|---|---|---|---|---|
| 4,903,221 | A * | 2/1990 | Krenz | 361/680 |
| 5,107,400 | A * | 4/1992 | Kobayashi | 361/685 |
| 5,175,672 | A * | 12/1992 | Conner et al. | 361/680 |
| 5,247,285 | A * | 9/1993 | Yokota et al. | 361/680 |
| 5,677,827 | A * | 10/1997 | Yoshioka et al. | 361/683 |
| 5,734,548 | A * | 3/1998 | Park | 361/680 |
| 6,108,716 | A | 8/2000 | Kimura et al. | |
| 6,530,784 | B1 | 3/2003 | Yim et al. | |
| D478,583 | S * | 8/2003 | Hyogo | D14/331 |
| D494,965 | S * | 8/2004 | Klimke | D14/300 |
| 6,778,382 | B1 | 8/2004 | Yim | |
| 2001/0048587 | A1 | 12/2001 | Yim | |
| 2003/0223190 | A1* | 12/2003 | Hashimoto | 361/683 |
| 2004/0160734 | A1 | 8/2004 | Yim | |

FOREIGN PATENT DOCUMENTS

| | | |
|---|---|---|
| EP | 1 085 397 | 3/2001 |
| JP | 9-148757 | 6/1997 |
| JP | 10-11189 | 1/1998 |
| JP | 10-133772 | 5/1998 |
| JP | 11-212665 | 8/1999 |
| JP | 2001-111253 | 4/2001 |

(Continued)

OTHER PUBLICATIONS

English translation of the excerpt from Sony personal computer "Vaio" desktop series, catalogue 2003.1.

*Primary Examiner*—Lynn Feild
*Assistant Examiner*—Anthony Q. Edwards
(74) *Attorney, Agent, or Firm*—Westerman, Hattori, Daniels & Adrian, LLP.

(57) ABSTRACT

A mounting mechanism of the present invention is provided with an elastic locking section which is pushed by the first unit which has moved in a mounting direction and elastically deformed, and enters a recess formed in the first unit upon completion of the mounting thereby to lock the first unit, and which receives a movement operation in an operating direction intersecting the mounting direction when the first unit is caused to leave the unit mounting section. The mounting mechanism is also provided with a run-on section onto which the elastic locking section runs when the elastic locking section has received a movement operation in the operating direction thereby to elastically deform the elastic locking member and release the recess of the first unit from the engagement of the elastic locking section.

15 Claims, 19 Drawing Sheets

FOREIGN PATENT DOCUMENTS

| | | |
|---|---|---|
| JP | 2001-142564 | 5/2001 |
| JP | 2001-154760 | 6/2001 |
| JP | 2001-331238 | 11/2001 |
| JP | 2002-6987 | 1/2002 |
| JP | 2002-149271 | 5/2002 |
| JP | 2002-207536 | 7/2002 |
| JP | 2002-222026 | 8/2002 |

* cited by examiner

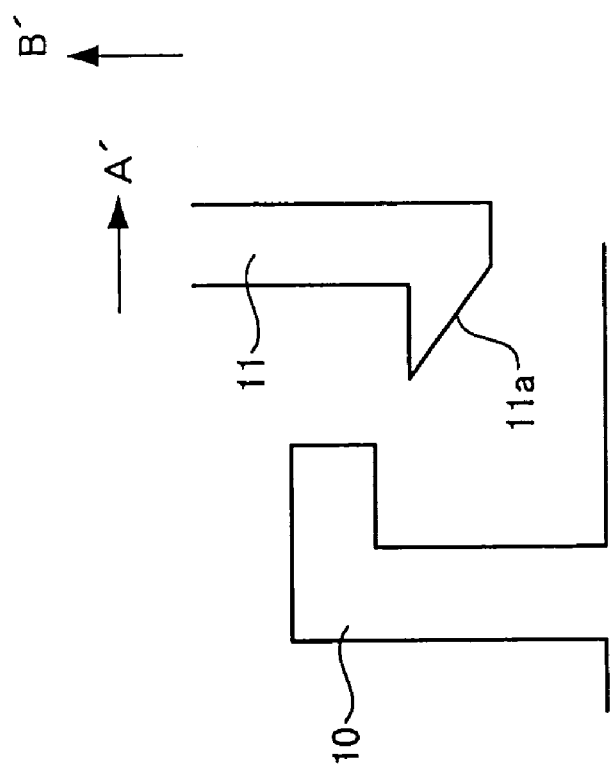
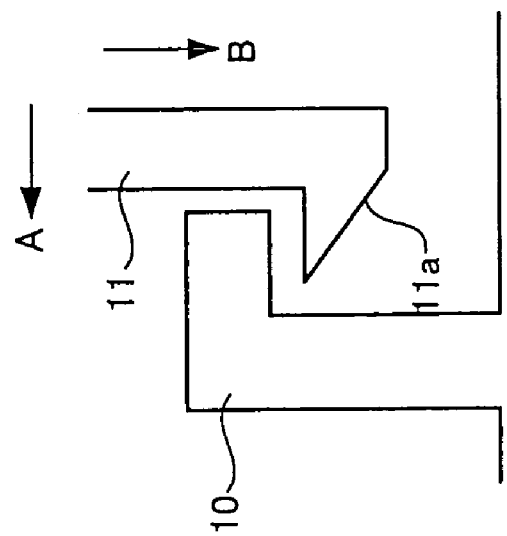
Fig.20 (B)
Fig.20 (A)

ELECTRONIC APPARATUS AND UNIT MOUNTING MECHANISM

CROSS-REFERENCE TO RELATED APPLICATIONS

This application is a U.S. continuation application of International Application No. PCT/JP2003/005882, filed on May 12, 2003.

TECHNICAL FIELD

The present invention relates to an electronic apparatus which is equipped with a first unit and a second unit having a unit mounting section where the first unit is removably mounted, and in which an electronic circuit is incorporated.

BACKGROUND ART

Various types of electronic apparatus have hitherto been developed and become widespread. Among them, a description will be given here of a personal computer having an information computation function as an example of electronic apparatus.

In addition to a stationary personal computer in which a main unit which is equipped with a CPU, a hard disk, etc. and which performs arithmetic processing, an image display device having a display screen which displays images, a keyboard to perform key operation, etc. are constructed as separate housings, there has come into widespread use a portable personal computer, called a notebook personal computer, in which an image display section having a display screen and a main frame section which incorporates a CPU performing arithmetic processing, a hard disk to store information, etc. and on the top surface of which keys are arranged to perform the role of a keyboard are connected to each other via hinges.

In this notebook personal computer, the display section and the main frame section can be brought into a double-folded superposed condition via the hinges. Therefore, the notebook personal computer is convenient for carrying. At the same time, by opening the display section and the main frame section, it is possible to perform key operation while looking at the display screen. Thus the notebook personal computer has user-friendliness.

Because in this notebook personal computer, importance is attached to portability and emphasis is given to a low-profile design in a folded condition, its performance is considerably sacrificed in terms of functions compared to a stationary personal computer. Also, there are many cases where even a notebook personal computer is not carried and usually it is used on a desk as with a stationary personal computer. Therefore, recent years have seen the emergence of an integrated personal computer which is provided with improved functions as well as portability to a certain degree, which portability is not so high as a notebook personal computer. This integrated personal computer is typically constituted by: a base section, which is placed on a flat surface such as a desk; a standing section, which is supported by the base section and installed in a standing manner thereon and which has a display screen; and a keyboard, which is attached to the standing section via hinges and opens and closes with respect to the standing section. In the case of this integrated personal computer, when not in use, it is possible to obtain a space on the desk by putting the keyboard against the standing section in such a manner as to be superposed thereon, and the integrated personal computer is also easy to carry because of the integral type.

Many of such notebook personal computers and integrated personal computers have hinges as described above, and it is ensured that these computers are housed in a compact manner when not in use and that they are convenient for carrying (refer to Patent Documents 1 and 2, for example).

In addition to the above-described construction that enables a personal computer to be folded by providing hinges, other constructions are also conceivable. For example, the portion of the keyboard is demounted from the display section and made independent of the display section, with the result that key operation is performed, with the keyboard placed in a free position demounted from the display section, and part of the functional portions of the personal computer are removable from the main frame section (refer to Patent Document 3). In this case, however, the mechanism of mounting and demounting poses a problem, that is, by what mechanism the locking during mounting and the unlocking during demounting are performed poses a problem.

For example, the Patent Document 4 discloses a conventional general lock mechanism, although this lock mechanism is an opening and closing lock mechanism used in folding and unfolding a personal computer, and not a lock mechanism used in mounting and demounting part of the functional portions to and from the main frame section.

(Patent Document 1)
Japanese Patent Laid-Open No. 10-11189
(Patent Document 2)
Japanese Patent Laid-Open No. 11-212665
(Patent Document 3)
Japanese Patent Laid-Open No. 10-133772
(Patent Document 4)
Japanese Patent Laid-Open No. 2002-149271

FIG. 20 (A) and FIG. 20 (B) are each a diagram which shows the lock mechanism described in Patent Document 4 above in a modeled form.

A moving hook 11 is urged in the direction in which the moving hook 11 approaches a fixed locking claw 10 (the direction of the arrow A). When the moving hook 11 moves in the direction of the arrow B, a tapered surface 11a of the moving hook 11 interferes with the fixed locking claw 10 and the moving hook 11 moves or rotates toward the side opposite to the arrow A. As a result of this, the moving hook 11 further moves in the direction of the arrow B by avoiding the fixed locking claw 10, which is an obstacle, and when the interference between the moving hook 11 and the fixed locking claw 10 is lost, the moving hook 11 returns in the direction of the arrow A due to the urging force of the moving hook 11 and brought into a locked condition as shown in FIG. 20 (A).

Motions necessary for releasing this lock are shown in FIG. 20 (B). It is necessary to cause motions such that in releasing this lock, the moving hook 11 is first moved in the direction of the arrow A' to permit movement in the direction of the arrow B' and then moved in the direction of the arrow B'.

However, in a lock mechanism as described above, the moving hook 11 is basically moved on the same straight line (on the straight line B–B') in a case where the moving hook 11 is locked (movement in the direction of the arrow B) and in a case where the lock is released (movement in the direction of the arrow B'). Therefore, a considerably large space is required in these directions. Also, in a case where the fixing force of the hook is to be increased, it is necessary that the engaging area of the hook be simply a large area. Also in this case, a large engaging area and a large area for the movement in the direction of the arrow A during unlocking are required, posing the problem that the lock mechanism becomes large in size.

In view of the above circumstances, the present invention which has as its object the provision of a unit mounting mechanism which can achieve miniaturization with a simple construction and can perform positive mounting and unlocking, and an electronic apparatus which is provided with this unit mounting mechanism.

DISCLOSURE OF THE INVENTION

An electronic apparatus of the present invention which achieves the above object is provided with a first unit and a second unit having a unit mounting section where the first unit is removably mounted, and in which an electronic circuit is incorporated, wherein:

the first unit has an engagement recess in a portion to be attached to the unit mounting section, and wherein the unit mounting section includes:

an elastic locking section which is pushed by the first unit which has moved in a mounting direction and elastically deformed, and enters the recess upon completion of the mounting thereby to lock the first unit, and which receives a movement operation in an operating direction intersecting the mounting direction when the first unit is caused to leave the unit mounting section; and a run-on section onto which the elastic locking section runs when the elastic locking section has received a movement operation in the operating direction thereby to elastically deform the elastic locking member and release the recess from the engagement of the elastic locking section.

In an electronic apparatus of the present invention, the mounting direction when the first unit is mounted is made different from the operating direction when operation to demount the first unit is performed, and by performing operation in the operating direction, the elastic locking section is caused to be elastically deformed in the same manner to release the engagement as the elastic deformation when the first unit is mounted. The structure is simple and that a wide space is not required in the unit mounting direction. Even in a case where a wide engaging area cannot be obtained, this structure permits positive mounting and demounting.

In the above-described electronic apparatus, it is preferred that the unit mounting section be provided with an urging member which urges the elastic locking section in a direction reverse to the operating direction thereby to position the elastic locking section in a locking place where the first unit which has been mounted is locked.

By providing such an urging member, the elastic member returns automatically to a place where mounting can be anew performed. Incidentally, a spring member can be used as this urging member.

Also, it is preferred that the recess and the elastic locking section be provided in plural pairs.

By providing plural pairs, mounting is performed in a more positive manner and a condition with stable position.

Also, the electronic apparatus of the present invention is concretely provided with a shaft which extends in the operating direction, and it is preferred that the elastic locking section include:

a claw section, which is positioned away from the shaft and ahead of the shaft in the mounting direction and protrudes to a position where the first unit enters the recess toward the recess in which the first unit has been mounted;

an elastic section which is positioned between the shaft and the claw and connects the shaft and the claw section together; and a run-on operating section which is provided adjacent to the claw section and runs onto the run-on section, and it is preferred that the elastic section cause the claw section to turn around the shaft.

In this case, it is preferred that an operating section be provided which receives operation and moves the shaft and the elastic locking section in the operating direction. It is also a preferred form that the unit mounting section is provided with an urging member (for example, a spring member) which urges the shaft and the elastic locking section in a direction reverse to the operating direction thereby to position the shaft and the elastic locking section in a locking place where the first unit which has been mounted is locked.

Furthermore, it is preferred that in the above-described concrete structure, the claw section have a tapered surface on both sides thereof ahead of and behind the mounting direction and a leading end of the claw section which enters the recess is formed in the shape of a spire. It is preferred that the elastic locking section be provided integral with the shaft and in plural numbers and the recess is provided in plural numbers corresponding to the elastic locking sections.

In addition, it is also a preferred form that the apparatus of the present invention has a third unit, the second unit is a hinge unit which is rotatably connected to the third unit via a hinge, and the first unit is releasably connected to the third unit, with the hinge unit interposed. Furthermore, for the electronic apparatus of the present invention, it is also a preferred form that the first unit, the hinge unit and the third unit are each provided with a circuit part.

A unit mounting mechanism of the present invention which achieves the above object removably mounts a unit which has an engagement recess in a portion to be attached to the mechanism, and includes: an elastic locking section which is pushed by the unit which has moved in a mounting direction and elastically deformed, and enters the recess upon completion of the mounting thereby to lock the unit, and which receives a movement operation in an operating direction intersecting the mounting direction when the unit is caused to leave the unit mounting section; and a run-on section onto which the elastic locking section runs when the elastic locking section has received a movement operation in the operating direction thereby to elastically deform the elastic locking member and release the recess from the engagement of the elastic locking section.

It is preferred that the above-described unit mounting mechanism be provided with an urging member (for example, a spring member) which urges the elastic locking section in a direction reverse to the operating direction thereby to position the elastic locking section in a locking place where the first unit which has been mounted is locked, and it is a preferred form that a unit to be mounted has the recess in plural numbers and this unit mounting mechanism has the elastic locking section in plural numbers corresponding to the recesses.

It is preferred that the above-described unit mounting mechanism concretely be provided with a shaft which extends in the operating direction, the elastic locking section include:

a claw section, which is positioned away from the shaft and ahead of the shaft in the mounting direction and protrudes to a position where the first unit enters the recess toward the recess in which the first unit has been mounted;

an elastic section which is positioned between the shaft and the claw and connects the shaft and the claw section together;

and a run-on operating section which is provided adjacent to the claw section and runs onto the run-on section, and the elastic section cause the claw section to elastically turn around the shaft.

Even in the unit mounting mechanism of this concrete structure, it is preferred to provide an operating section which receives an operation and moves the shaft and the elastic locking section in an operating direction, and it is preferred to provide an urging member which urges the shaft and the elastic locking section in a direction reverse to the operating direction thereby to position the shaft and the elastic locking section in a locking place where the first unit which has been mounted is locked. A spring member may be used as the urging member.

Furthermore, in the unit mounting mechanism of the above-described concrete structure, it is preferred that the claw section have a tapered surface on both sides thereof ahead of and behind the mounting direction and that a leading end of the claw section which enters the recess be formed in the shape of a spire. It is also a preferred form that a unit to be mounted has the recess in plural numbers and that this unit mounting mechanism has the elastic locking section in plural numbers corresponding to the recesses.

BRIEF DESCRIPTION OF THE DRAWINGS

FIG. 20 (A) is a diagram which shows a conventional lock mechanism in a modeled form.

FIG. 20 (B) is a diagram which shows a conventional lock mechanism in a modeled form.

BEST MODE FOR CARRYING OUT THE INVENTION

Embodiments of the present invention will be described blow.

Descriptions will be given here of the above-described integrated personal computer as an embodiment of an electronic apparatus of the present invention.

Figure 1:
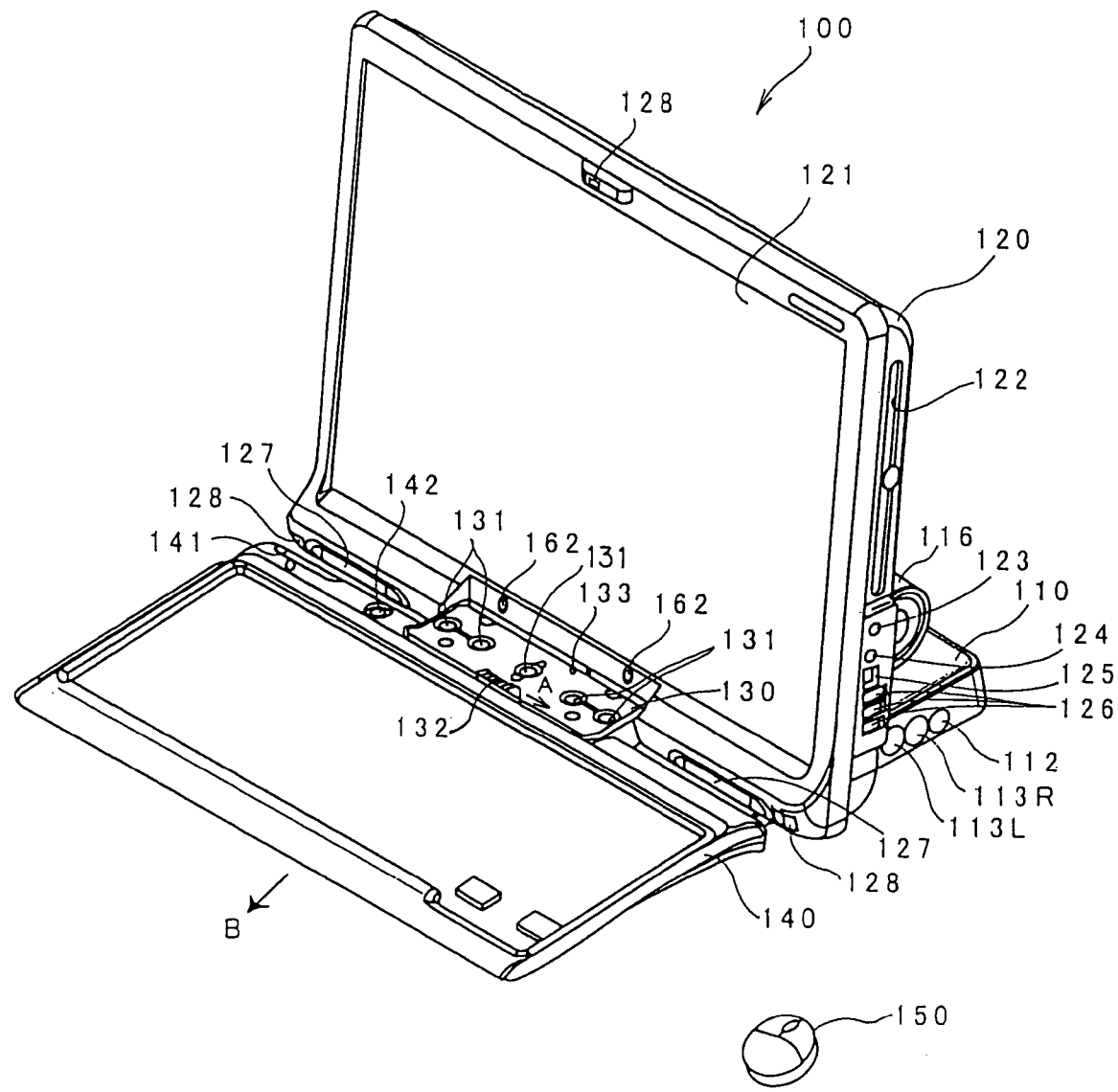
FIG. 1 is a perspective view which shows the appearance of an open condition of an integrated personal computer in one embodiment of an electronic apparatus of the present invention.
Figure 2:
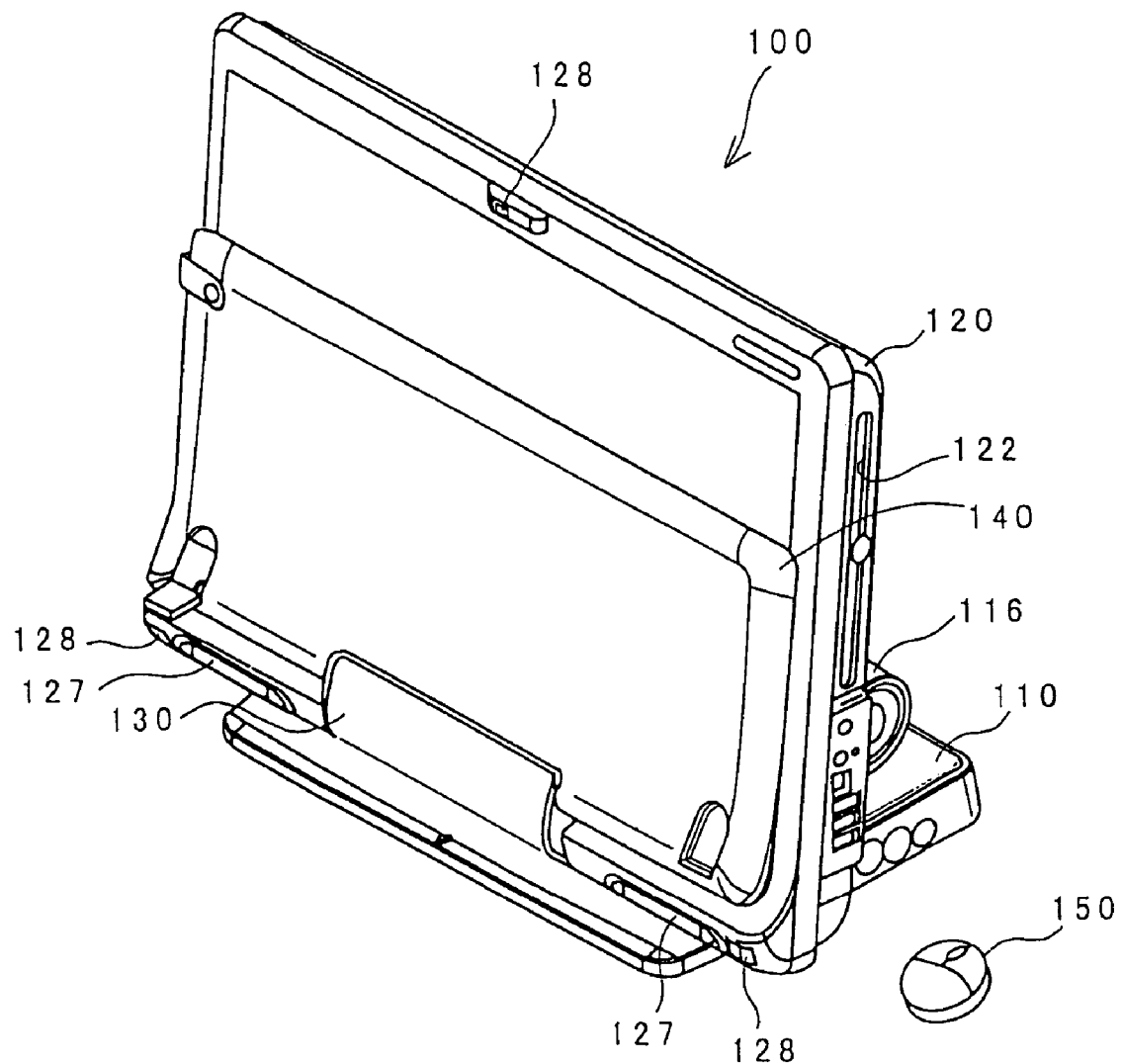
FIG. 2 is a perspective view which shows the appearance of a closed condition of an integrated personal computer in one embodiment of an electronic apparatus of the present invention.

FIG. 1 and FIG. 2 are each a perspective view which shows the appearance of, respectively, an open condition and closed condition of an integrated personal computer in one embodiment of an electronic apparatus of the present invention.

This integrated personal computer 100 is constituted by a base section 110, a standing section 120, a hinge unit 130, a keyboard 140, and a mouse 150.

Figure 15:
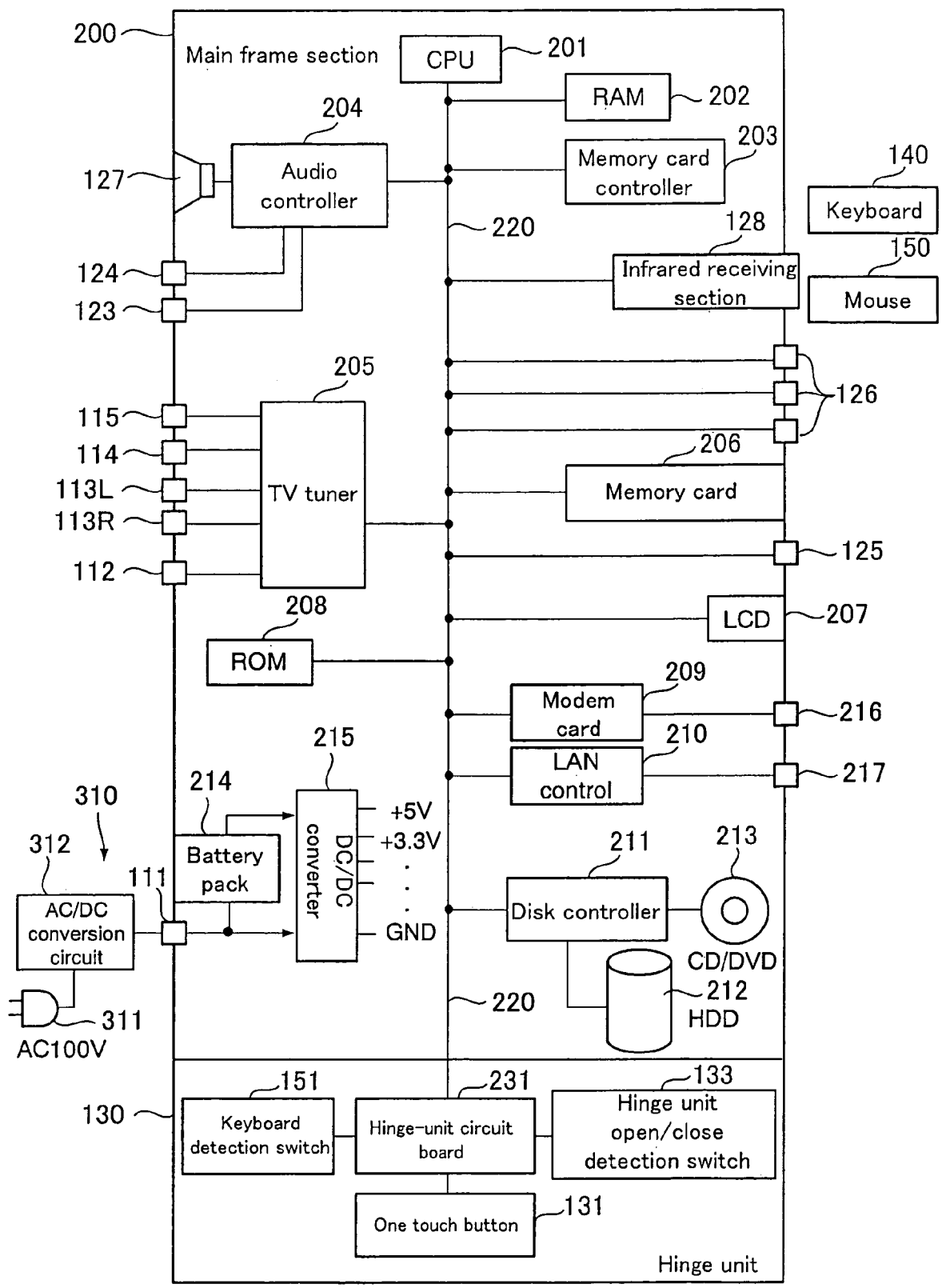
FIG. 15 is a circuit block diagram of an integrated personal computer.

The base section 110 is a portion which becomes a base to be placed on a horizontal surface of a desk etc. This base section 110 is equipped with a battery pack (not shown) and, as shown in FIG. 15, the base section 110 is provided with an AC adapter connection terminal 111, an antenna input terminal 112 connected to a TV antenna, audio input terminals 113R and 113L, an S video input terminal 114 and a video input terminal 115. Furthermore, a woofer 116 is provided in an upper part of the base section 110.

The standing section 120 is, as illustrated, supported on the base section 110 in a standing manner, and the standing section 120 has a liquid crystal display screen 121 in the front thereof. The shaft of the standing section 120 is rotatably supported on the base section 110 to permit rotation through an angle so that an elevation angle of the liquid crystal display screen 121 can be adjusted. Also, this standing section 120 is equipped with main arithmetic processing portions as a computer, such as a CPU and a hard disk, on the back surface side of the display screen 121. What is externally shown in FIG. 1 includes a CV/DVD loading slit 122 into which a CD and a DVD are loaded, a headphone output terminal 123 into which a headphone jack is inserted, a microphone input terminal 124 into which a microphone jack is inserted, a connector terminal 125 into which the connector of a communication cable which conforms to the IEEE 1394 Communication standards is inserted, three connector terminals 126 into which the connectors of communication cables in conformance to the USB Communication Standards, two right and left speakers 127, and a total of three infrared receiving sections 128, one each in the right and left lower parts and one in the upper part. These infrared receiving sections 128 receive infrared rays for communication which are emitted from the keyboard 140 and the mouse 150, which will be described later.

The hinge unit 130 is provided with five one-touch buttons 131, and the hinge unit 130 incorporates a circuit board on which circuits which detect the operations of these one-touch buttons 131 and transmits them to the standing section are loaded.

Each function, such as start of an Internet program upon depressing of a certain one-touch bottom, can be allocated to each of these five one-touch buttons 131.

This hinge unit 130 removably supports the keyboard 140, and the hinge unit 130 is provided with a demounting operation button 132 used to demount the keyboard 140 mounted on the hinge unit 130 from the hinge unit 130.

Figure 3:
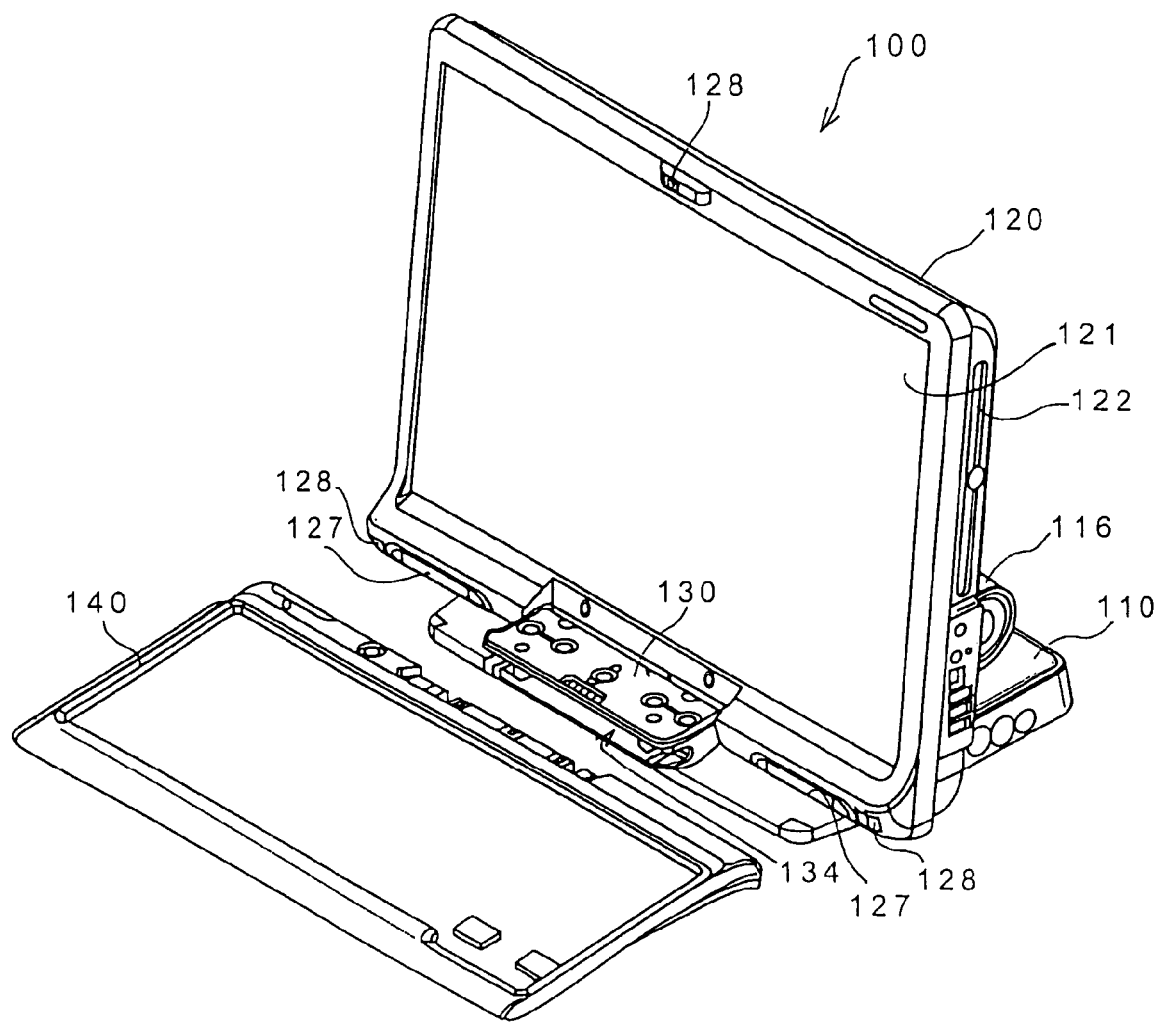
FIG. 3 is a perspective view of a keyboard detached from a hinge unit.

FIG. 3 is a perspective view of the keyboard 140 demounted from the hinge unit 130.

A keyboard biting section 134, which extends right and left and bites the keyboard 140, is formed in the hinge unit 130. When the keyboard 140 in the posture as shown in FIG. 3 is fitted into the keyboard biting section 134 of the hinge unit 130, the keyboard 140 becomes mounted on the hinge unit 130. When the demounting operation button 132 is operated in a sliding manner in the direction of the arrow A shown in FIG. 1, the engagement between the keyboard 140 and the hinge unit 130 is released and the keyboard 140 is demounted from the hinge unit 130 as shown in FIG. 3 by drawing the keyboard 140 in the direction of the arrow B shown in FIG. 1.

Figure 4:
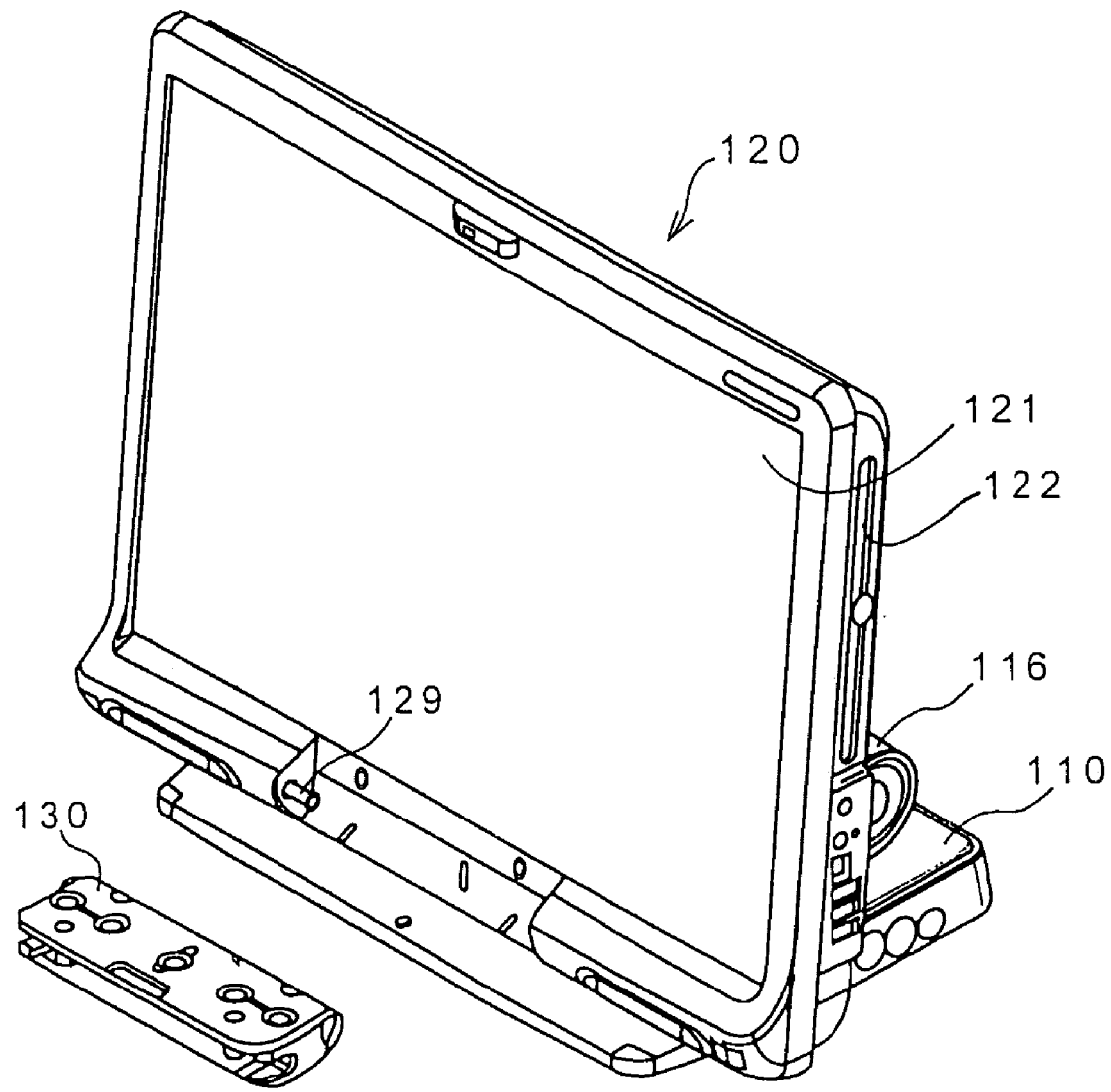
FIG. 4 is a perspective view of a hinge unit detached from a standing section.

FIG. 4 is a perspective view of the hinge unit demounted from the standing section.

The hinge unit 130 is rotatably supported by a supporting shaft 129 provided in the standing section 120 and can rotate on the supporting shaft 129 to ensure that the keyboard 140 mounted on the hinge unit 130 can rotate between a closed condition in which the keyboard 140 superposes the standing section 120 to cover the liquid crystal display screen 121, which is shown in FIG. 2, and an open condition in which the keyboard 140 opens from the standing section 120 to expose the whole area of the liquid crystal display screen 121, which is shown in FIG. 1.

The hinge unit 130 is provided with a hinge-unit open/close detection switch 133 (refer to FIGS. 1 and 14), which detects whether the hinge unit 130 is in an open condition shown in FIG. 1 or in a closed condition shown in FIG. 2, and also a keyboard detection switch 151 (refer to FIG. 13), which detects whether the keyboard 140 is mounted on the hinge unit 130 as shown in FIG. 1 or the keyboard 140 is demounted from the hinge unit 130 as shown in FIG. 3. In the circuit on the circuit board incorporated in the hinge unit 130, in addition to the detection of the depression of the five one-touch keys 131, the on/off operations of the hinge unit open/close detection switch 133 and the keyboard detection switch 151 are also detected.

Incidentally, the standing section 120 is provided with receiving sections 162 formed from an elastic body such as rubber (refer to FIG. 1). The receiving sections 162 flexibly receive the abutment by the hinge unit 130 when the integrated personal computer is folded double as shown in FIG. 2.

A large number of keys (not shown) which receive key operations are arranged on the keyboard 140. In addition, the keyboard 140 is provided with an infrared sending section 141 which sends key operation information and a suspend button 142 to raise this integrated personal computer 100 from a suspend condition. Key operation information sent from the infrared sending section 141 of the keyboard 140 is received at an infrared receiving section 128 provided in the standing section 120.

The mouse 150 is also provided with an infrared sending section which sends the operation information of the mouse 150 (not shown here), and also the mouse operation information sent from this infrared sending section is received at the infrared receiving section 128 of the standing section 120.

For the size of the keyboard 140, the horizontal size is almost equal to the standing section 120, but the depth size of FIG. 1 (the vertical direction in the closed condition shown in FIG. 2) is shorter than the standing section 120. For this reason, in the closed condition shown in FIG. 2, the keyboard 140 covers part of the display screen 121 of the standing section 120, and even in the closed condition shown in FIG. 2, the upper about ⅓ region of the display screen 121 remains exposed.

Next, a mechanism of mounting and demounting of the keyboard 140 onto and from the hinge unit 130 will be described.

Figure 5:
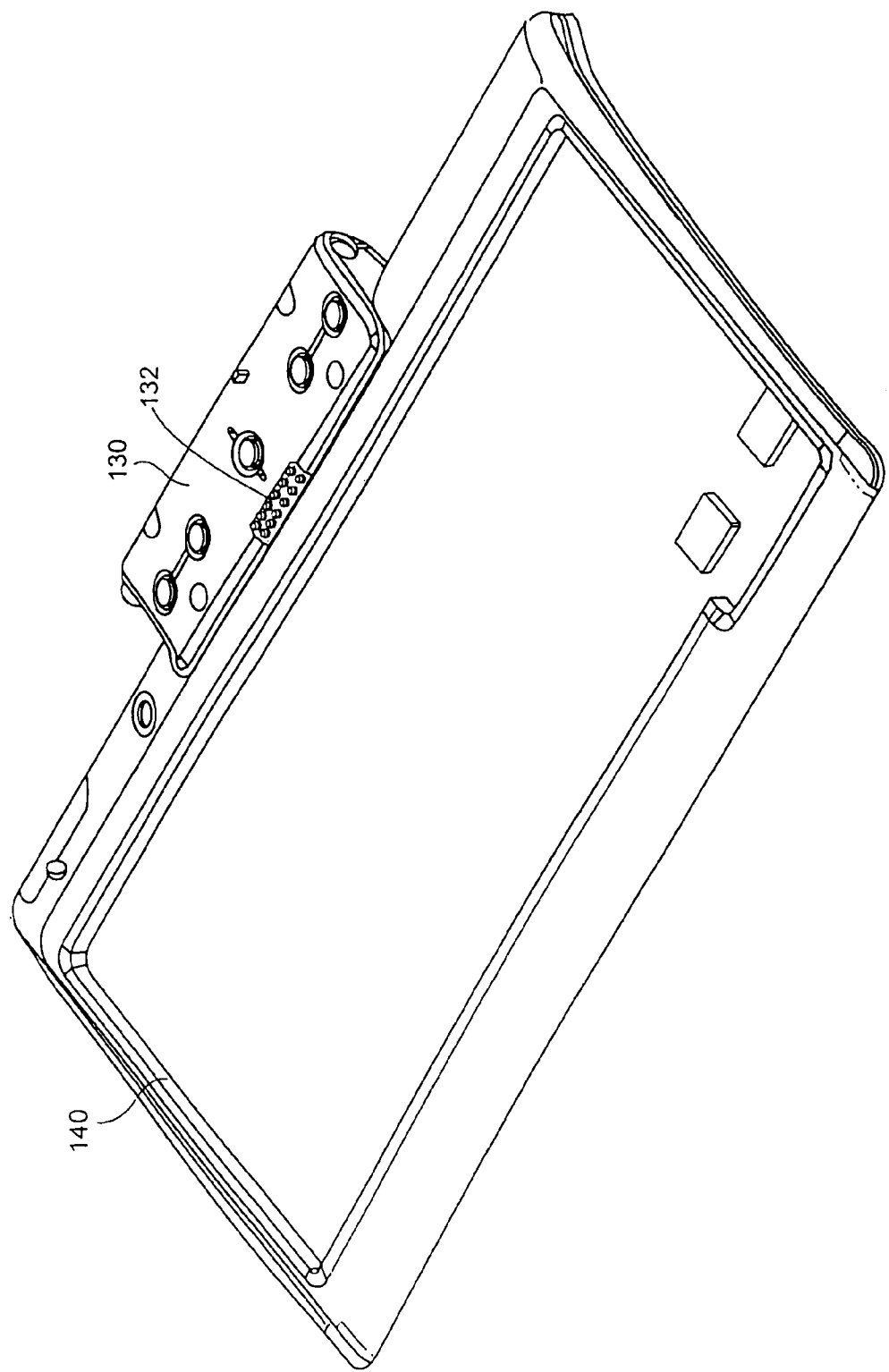
FIG. 5 is a perspective view of a hinge unit and of a keyboard mounted on the hinge unit.
Figure 6:
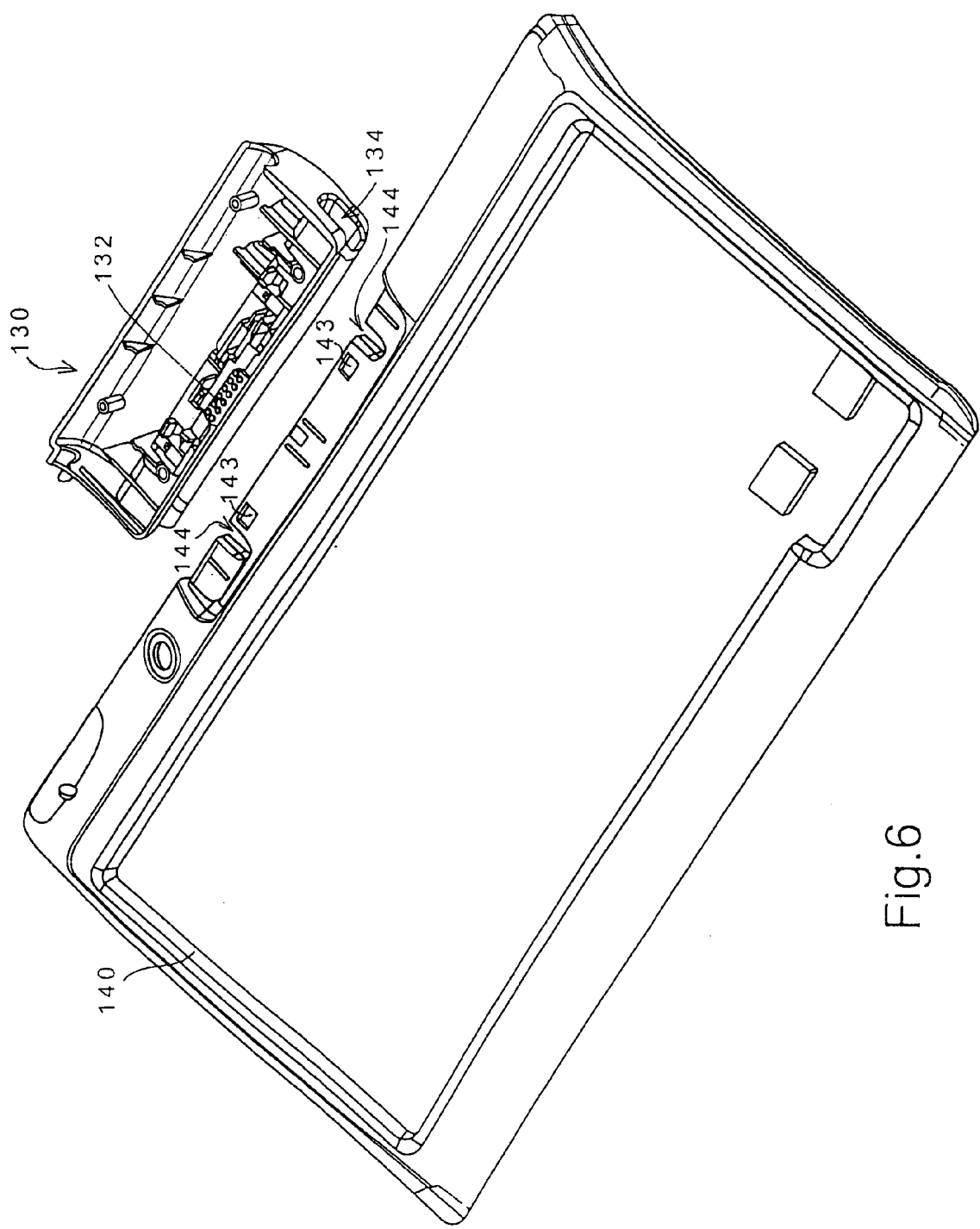
FIG. 6 is a perspective view of a hinge unit in a condition showing an internal mechanism by removing a top cover and of a keyboard detached from the hinge unit.
Figure 7:
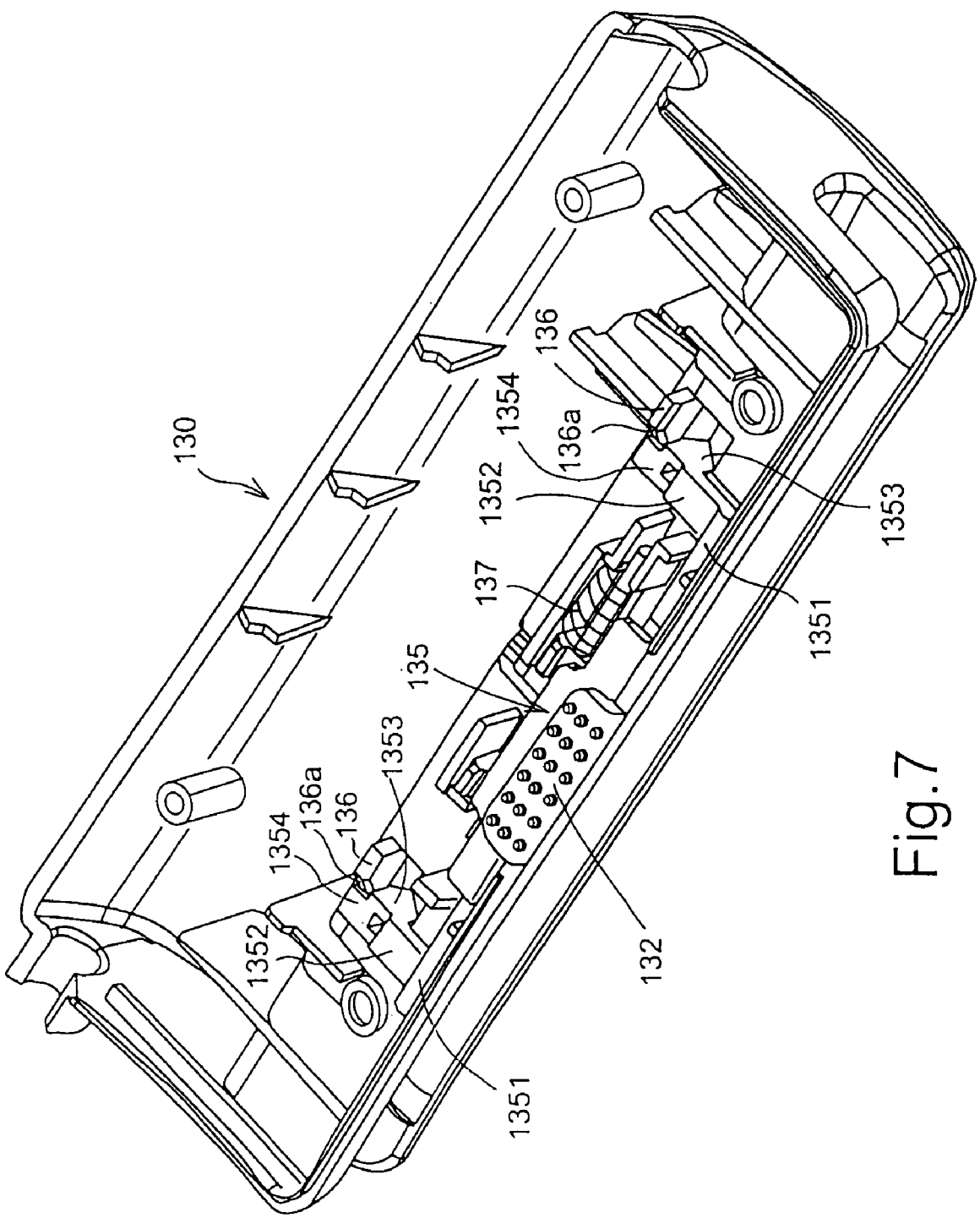
FIG. 7 is an enlarged perspective view of the hinge unit in a condition showing the internal mechanism, which is shown in FIG. 6.
Figure 8:
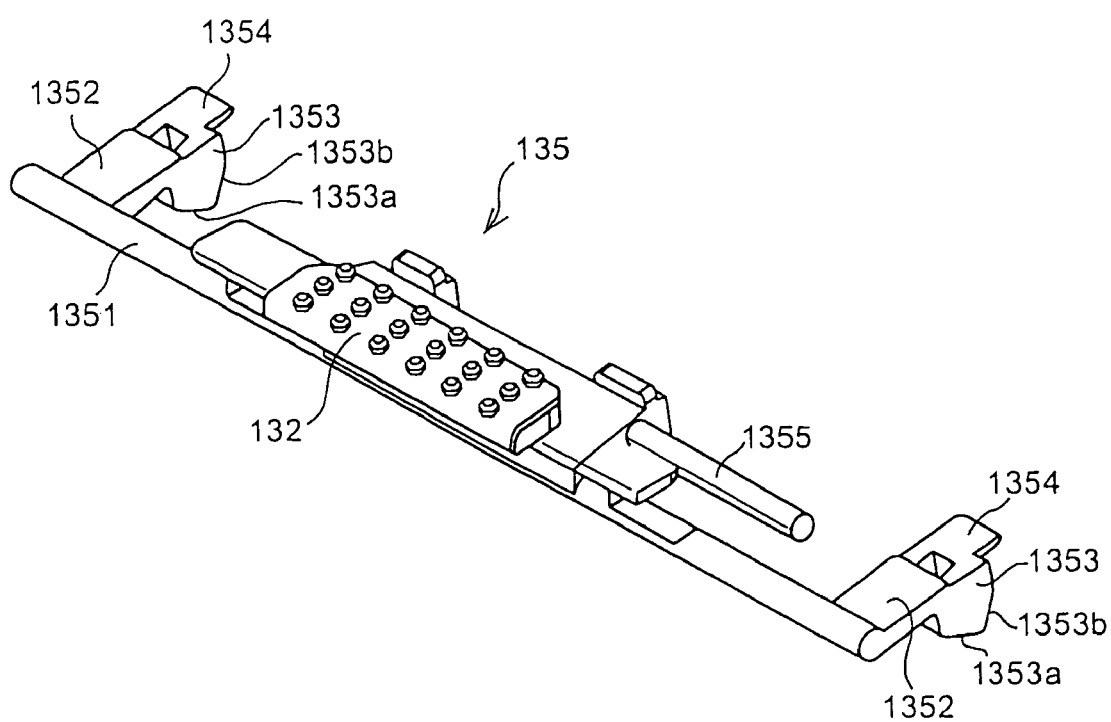
FIG. 8 is a perspective view of a hook part provided in the interior of the hinge unit.

FIG. 5 is a perspective view of the hinge unit and of the keyboard mounted on the hinge unit. FIG. 6 is a perspective view of the hinge unit in a condition showing an internal mechanism by removing a top cover and of the keyboard detached from the hinge unit. FIG. 7 is an enlarged perspective view of the hinge unit in a condition showing the internal mechanism, which is shown in FIG. 6. FIG. 8 is a perspective view of a hook part provided in the interior of the hinge unit.

As shown in FIG. 6, the keyboard 140 has two engagement recesses 143 and two guide grooves 144 for mounting. On the other hand, a hook part 135 constituting the hinge unit 130, which is shown in FIG. 8, is composed of demounting operation button 132, a shaft 1351 on which the demounting operation button 132 is integrally fixed, plate sections 1352 which extend from the two right and left sides of the shaft 1351 to the interior side of the slit-like biting section 134, which is shown in FIG. 6, hooks 1353 which protrude downward from the leading ends of the plate sections 1352, projections 1354 which are provided adjoining the hooks 1353 and ride onto operating guides 136 (refer to FIG. 7), which will be described later, and a rod 1355 which is inserted into a coil spring 137 (refer to FIG. 7). The plate section 1352, the hook 1353 and the projection 1354 in their complex form correspond to an elastic locking claw, which is an example of the elastic locking section according to the present invention.

The material for the hook part 135 is polyoxymethylene/polyacetal resin (popular name: POM). This material is suitable for use in moving parts because of its good wear resistance and good slip.

The hook 1353 has tapered surfaces 1353*a*, 1353*b* on both sides back and forth in the direction moving toward the interior of the slit-like biting section 134, which is shown in FIG. 6, (in the mounting direction of the keyboard 140) and formed in the shape of a spire down toward the leading end, and the leading end of the hook 1353 protrudes to a position where this leading end enters the engagement recess 143 of the keyboard 140 shown in FIG. 6 when the keyboard 140 has been mounted. Out of the two tapered surfaces 1353a, 1353*b* formed on the hook 1353, the tapered surface 1353*a* on the front side (the keyboard 140 side shown in FIG. 6) of the biting section 134 (refer to FIG. 6) is a tapered surface close to a horizontal compared to the tapered surface 1353*b* on the back side. Therefore, the keyboard 140 which has been mounted can be more easily received. On the other hand, the reason why the tapered surface 1353*b* on the back side rises is that it is thereby ensured that the keyboard 140, once mounted, cannot easily disengage.

This hinge unit 130 is provided with two posts 138 (refer to FIG. 9) which enter the two guide groves 144, which are provided in the keyboard 140, when the keyboard 140 is being mounted on the biting section 134.

The coil spring 137 shown in FIG. 7 urge the hook part 135 to the left of FIG. 7, and in a position where the hook 1353 of the hook part 135 has been sifted to the left due to the urging, the hook 1353 of the hook part 135 is adapted to enter the engagement recess 143 of the keyboard 140 which is being mounted.

Next, the process of mounting and demounting of the keyboard by the above-described mechanism will be described.

Figure 9:
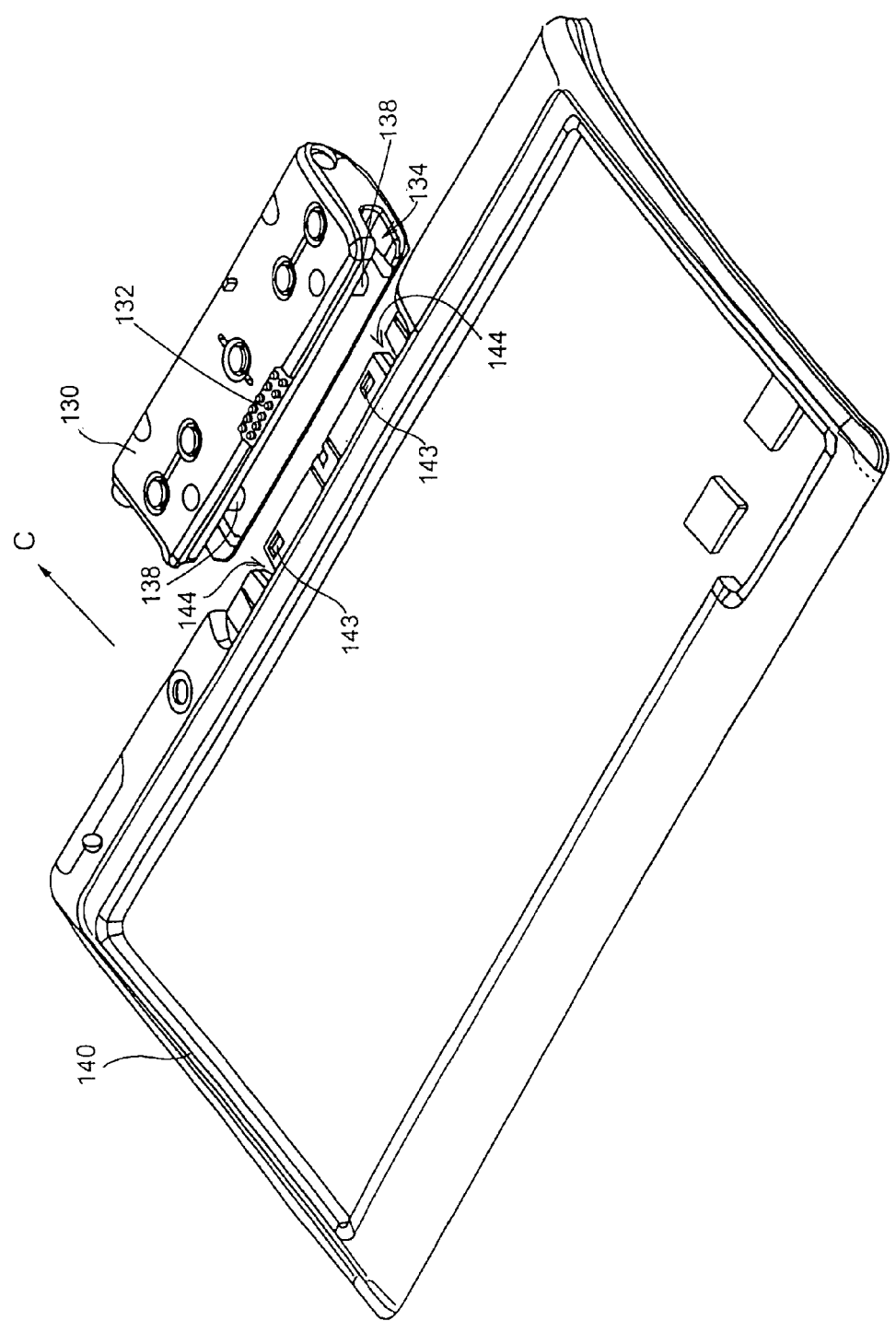
FIG. 9 is a perspective view of a hinge unit and a keyboard before the mounting of the keyboard.
Figure 10:
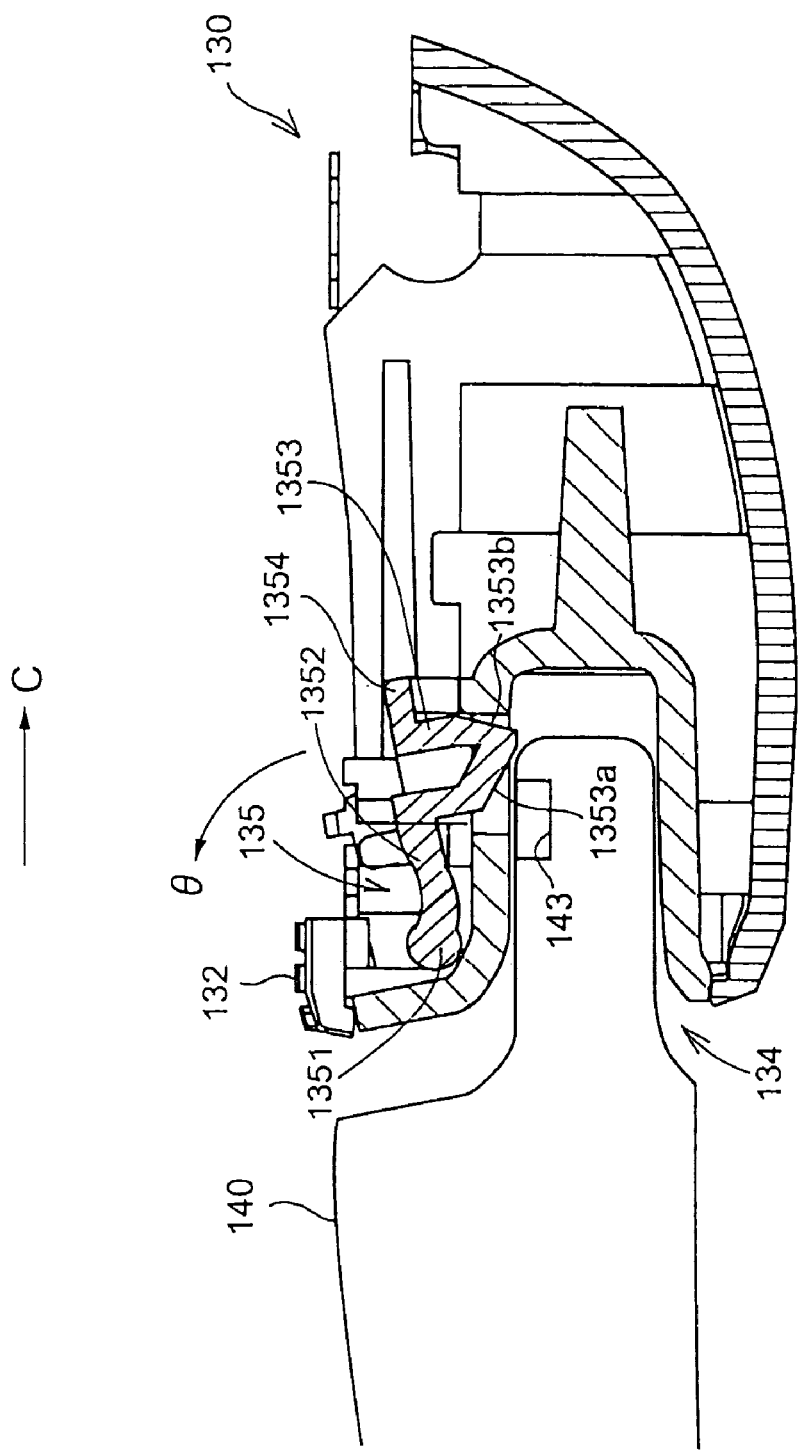
FIG. 10 is a sectional view of a keyboard which is being mounted, the view taken in a mounting direction.
Figure 11:
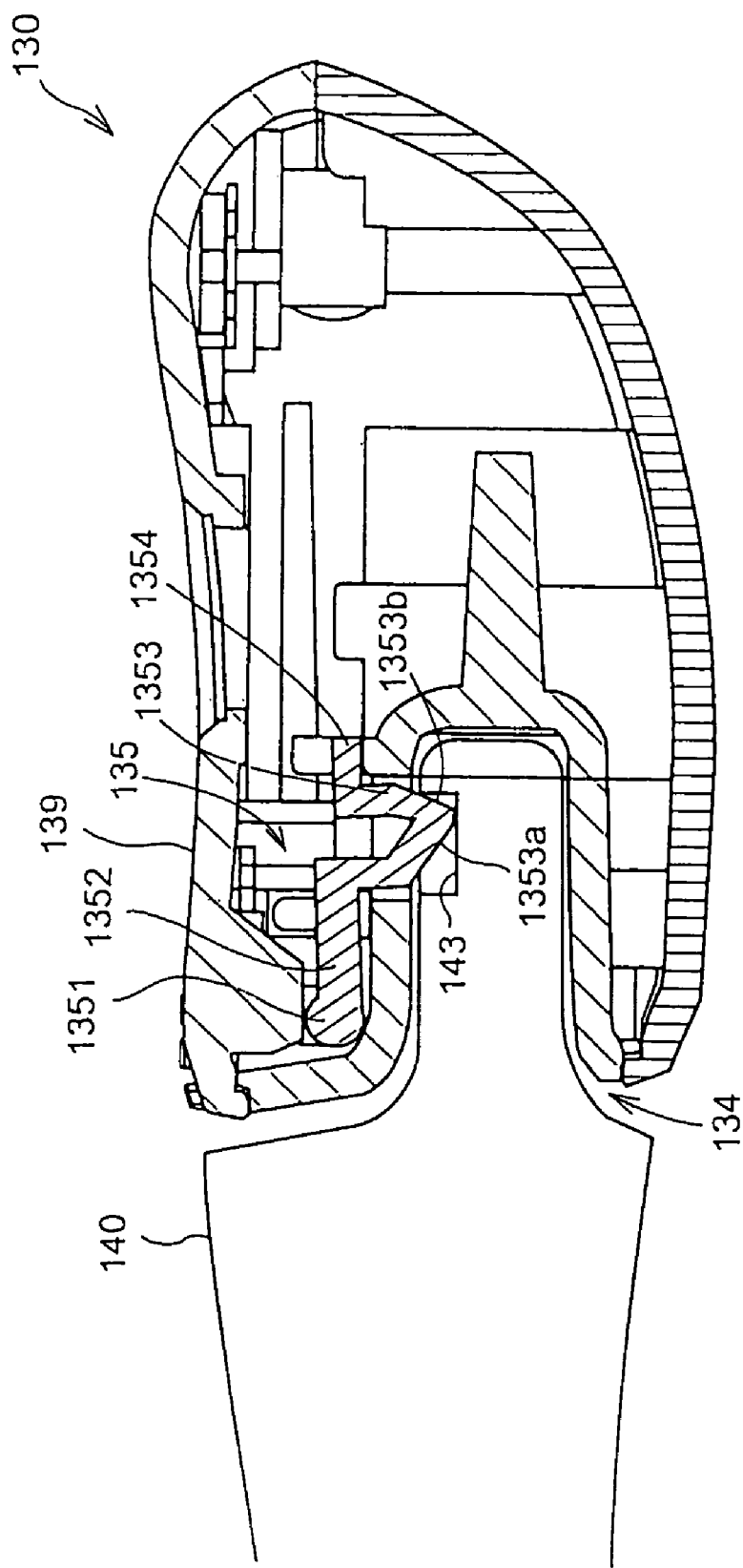
FIG. 11 is a sectional view of a keyboard upon completion of mounting, the view taken in a mounting direction.

FIG. 9 is a perspective view of the hinge unit and the keyboard before the mounting of the keyboard. FIG. 10 is a sectional view of the keyboard which is being mounted, the view taken in the mounting direction. FIG. 11 is a sectional view of the keyboard upon completion of mounting, the view taken in the mounting direction.

However, in FIG. 10, a top cover 139 of the hinge unit 130 shown in FIG. 11 is omitted from the figure. The top cover 139 serves to hold a shaft 1351 of the hook part 135 from above, as shown in FIG. 11.

As shown in FIG. 9, when the keyboard 140 is being mounted toward the hinge unit 130 in the mounting direction (the direction of the arrow C), the post 138 provided in the keyboard biting section 134 of the hinge unit 130 enters the guide groove 144 provided in the keyboard 140, and the mounting position is guided.

When the keyboard 140 is being mounted on the keyboard biting section 134, as shown in FIG. 10, the tapered surface 1353a of the hook 1353 of the hook part 135 is pushed by the leading end of the keyboard 134 and the plate section 1352 of the hook part 135 deflects, whereby the hook 1353 rotates in the direction of the arrow θ of FIG. 10 and this enables the keyboard 140 to advance deeper than the hook 1353, which is an obstacle. When the keyboard 140 has advanced deeper than the position shown in FIG. 10 (in the direction of the arrow C), as shown in FIG. 11, the engagement recess 143 provided in the keyboard 140 reaches the position of the hook 1353, and the hook 1353 enters the recess 143 due to the elastic reaction force of the plate section 1352. The tapered surface 1353b of the hook 1353 on the interior side of the keyboard biting section 134 is a tapered surface which is considerably close to a vertical. Therefore, even when the hook 1353 once enters the recess 143, even when a force is applied in the direction of demounting the keyboard 140, it will not occur that the tapered surface 1353b would interfere with the side surface of the recess 143 and slip off.

Figure 12:
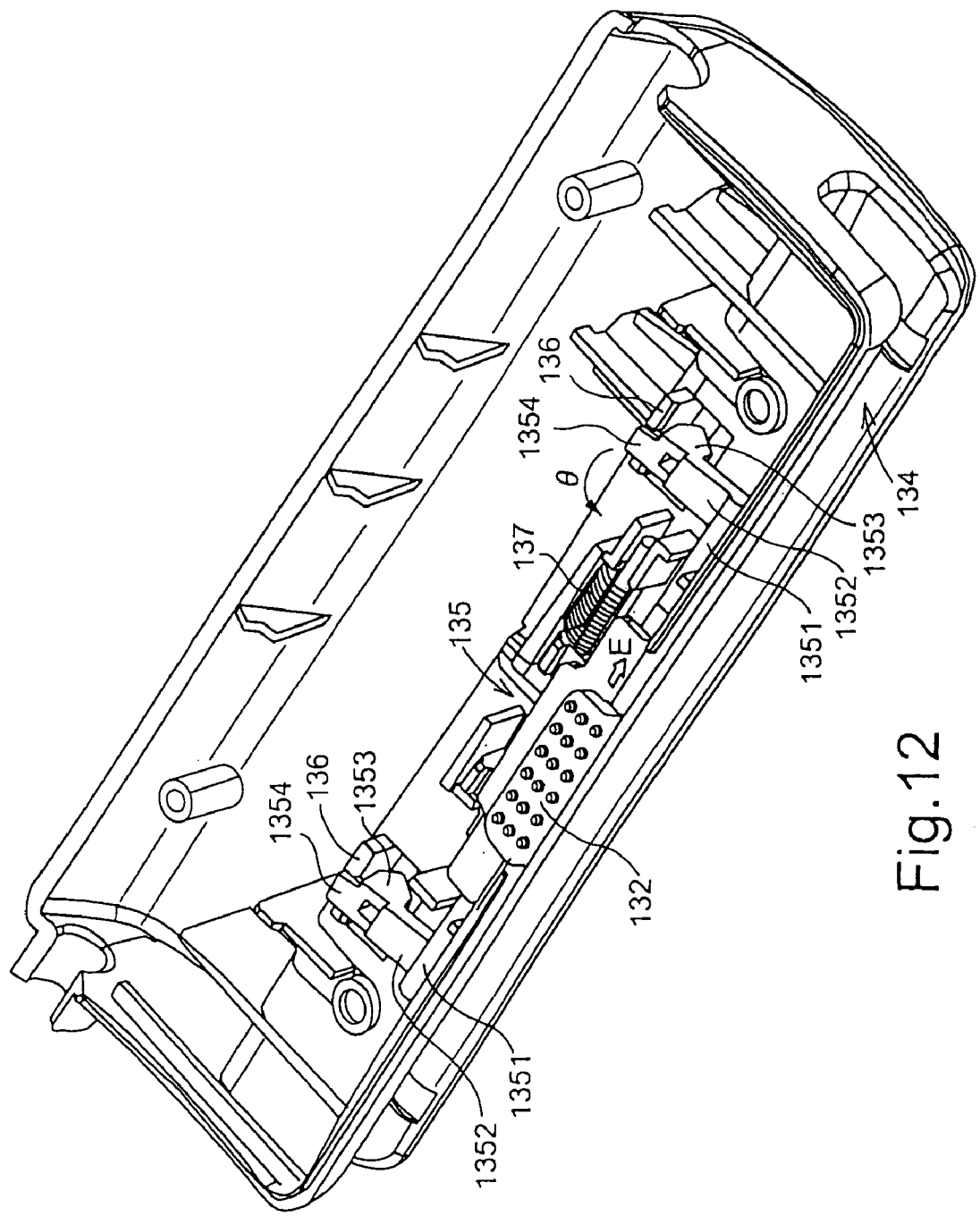
FIG. 12 is a diagram which shows an internal structure of a hinge unit to explain the operation when a keyboard is demounted from the hinge unit.

FIG. 12 is a diagram which shows an internal structure of the hinge unit to explain the operation when the keyboard is detached from the hinge unit.

Compared to FIG. 7, FIG. 12 shows the demounting operation button 132 which has been moved a little with a finger in the direction of the arrow E shown FIG. 12 against the urging force of the coil spring 137. At this time, the projection 1354 of the hook part 135 interferes with an inclined surface 136a (refer to FIG. 7) provided in the operating guide 136 and rides onto the surface 136a, whereby the plate section 1353 deflects and the hook 1353, along with the projection 1354, rotates in the direction of the arrow θ. As a result, the hook 1353 becomes disengaged from the engagement recess 143 of the keyboard 140 (refer to FIG. 6). By drawing the keyboard 140 from the hinge unit 130 in a direction reverse to the direction of mounting (the direction of the arrow C of FIG. 9), with this state kept, it is possible to demount the keyboard 140 from the hinge unit 130.

When after the demounting of the keyboard 140, the finger is taken off from the demounting operation button 132 of the hinge unit 130, the hook part 135 including the demounting operation button 132 returns, due to the urging force of the coil spring 137, to a position where the hook 1353 enters the engagement 143 of the keyboard 140 when the keyboard 140 is again being mounted.

Figure 13:
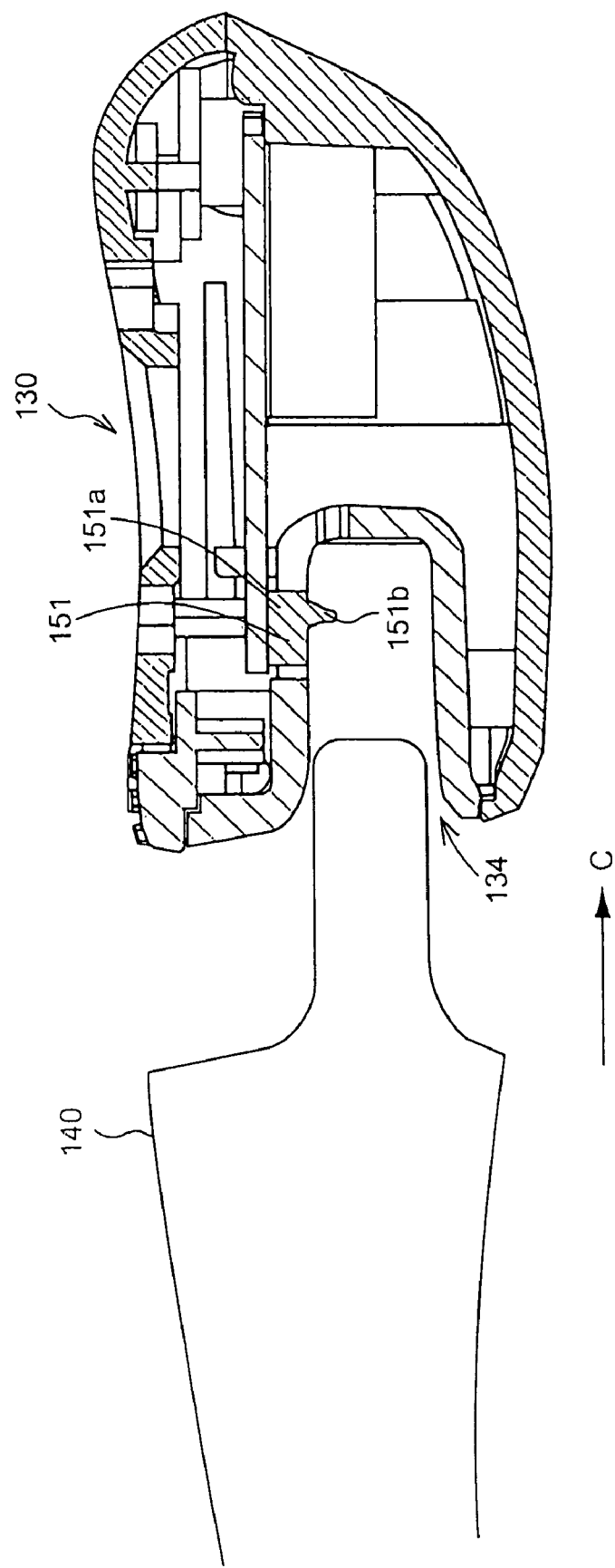
FIG. 13 is a sectional view of a hinge unit, the view taken in a mounting direction of a keyboard.

FIG. 13 is a sectional view of the hinge unit, the view taken in the mounting direction of the keyboard. However, this FIG. 13 is a sectional view taken in a different position from FIGS. 10 and 11.

A keyboard detection switch 151 which detects the mounting and demounting of the keyboard 140 is provided in the interior of the keyboard biting section 134 of the hinge unit 130. This keyboard detection switch 151 has a projection 151b which can project into the route of the keyboard 140 in such a manner as to freely fit into the main body section 151a, and when the keyboard 140 has been mounted, the projection 151b is pushed by the keyboard 140 and fits into the main body section 151a, whereby it is detected that the keyboard 140 has been mounted on the hinge unit 130. When the keyboard 140 has been demounted from the hinge unit 130, the projection 151b of the keyboard detection switch 151 is urged by a spring, which is not shown, and brought into a condition in which, as shown in FIG. 13, the projection 151b projects into the keyboard biting section 134 from the main body section 151a. As a result of this, it is detected that the keyboard 140 has been demounted from the hinge unit 130.

Figure 14:
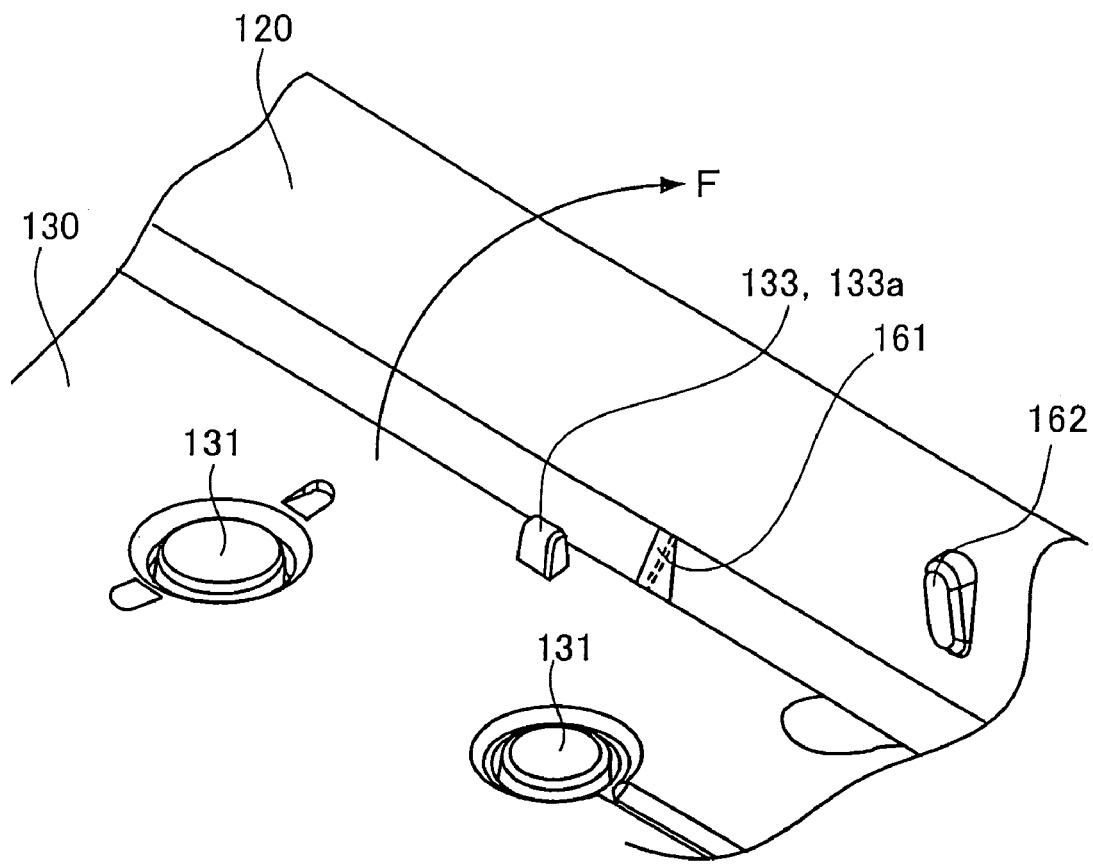
FIG. 14 is an enlarged view of the portion of a hinge unit open/close detection switch of the integrated personal computer shown in FIG. 1.

FIG. 14 is an enlarged view of the portion of the hinge unit open/close detection switch 133 of the integrated personal computer shown in FIG. 1.

In this hinge unit open/close detection switch 133, its main body section is disposed in the interior of the hinge unit 130 and a projection 133a is urged by a spring member, which is not shown, and projects from the surface of the hinge unit. When the hinge unit 130 is rotated in the direction of the arrow F of FIG. 14 and brought from the open condition shown in FIG. 1 into the closed condition shown in FIG. 2, the projection 133a of the hinge unit open/close detection switch 133 abuts against a convexity 161 provided in the standing section 120, whereby it is detected that the hinge unit 130 is in a closed condition. On the other hand, when the hinge unit 130 is opened from the closed condition shown in FIG. 2 to the open condition shown in FIG. 1, the projection 133a of the hinge unit open/close detection switch 133 projects from the surface of the hinge unit 130, whereby it is detected that the hinge unit is in an open condition.

FIG. 15 is a circuit block diagram of the integrated personal computer 100 which has been described above.

A main frame section 200 shown in this FIG. 15 corresponds to a portion obtained by combining the base section 110 and the standing section 120 shown in FIG. 1, and this main frame section 200 is provided with a CPU 201, a RAM 202, a memory card controller 203, an audio controller 204, a TV tuner 205, a memory card 206, a liquid crystal display section 207, a ROM 208, a modem card 209, a LAN control section 210, and a disk controller 211, further the infrared receiving section 128 shown in FIG. 1, a connector terminal 125 in conformity to the IEEE 1394 Standard, and a connector terminal 126 in conformity to the USB Standard, and these parts are interconnected via a bus 220.

The CPU 201 is an element which performs various kinds of arithmetic operation by executing programs.

The RAM 202 is a memory in which programs executed at the CPU 201 are expanded for execution and which is used as a working memory during the execution of programs in the CPU 201.

The memory card controller 203 is a controller which has access to the memory card 206.

The audio controller 204 is connected to a headphone output terminal 123, a microphone input terminal 124 and a speaker 127, and plays a role in converting audio signals inputted from the microphone input terminal 124 into digital signals and embedding the digital signals into the interior and in converting digital signals sent via the bus 220 into analog audio signals and sending the analog audio signals to the speaker 127 and the headphone output terminal 123.

As described above, the infrared receiving section 128 receives operating information of the keyboard 140 and the mouse 150.

The TV tuner 205 is connected to the antenna input terminal 112, the audio input terminals 113R, 113L, the S video input terminal 114 and the video input terminal 115 and serves as an element which performs TV broadcasting, video picture recording, playing back, etc.

The memory card 206 is a portable memory card capable of being freely inserted into this integrated personal computer, for example, a memory stick, an SD memory card, etc. This memory card 206 can be accessed by the memory card controller 203.

The liquid crystal display (LCD) section 207 is provided with the liquid crystal display screen 121 shown in FIG. 1 and has a role in displaying various images on the liquid crystal display screen 121 according to the instructions of the CPU 201.

The ROM 208 is a storage element which stores fixed data and programs.

The modem card 209 is an element which performs a kind of communication and is connected to a communication connector 216.

Also, the LAN control section 210 is an element which performs a kind of communication and is connected to a communication connector 217.

Furthermore, the disk controller 211 plays a role in accessing a hard disk 212 housed in the main body section 200 and a CD or a DVD 213 loaded from the CD/DVD loading slit 122 shown in FIG. 1.

Furthermore, an AC adapter 310 provided with an AC/DC conversion circuit 312 which converts an AC current into a DC current with a plug socket 311 is inserted into the AC adapter connection terminal 111. The main frame section 200 is provided with a battery pack 214 and a DC/DC converter 215. When the AC adapter 310 is inserted into the AC adapter connection terminal 111 and power is supplied from this AC adapter 310, the battery pack 214 is charged with the supplied power and the DC/DC converter 215 generates DC power of multiple voltages from the supplied power and supplies this DC power to each portion of this integrated personal computer which requires power. When the supply of power from the AC adapter input terminal 111 is stopped, for example, when the AC adapter 310 is withdrawn from the AC adapter connection terminal 111, the DC/DC converter 215 receives the supply of power from the battery pack 214. Therefore, this integrated personal computer can work even without the AC adapter while power remains in the battery pack 214.

For the changeover of the power supply from this AC adapter 310 and the battery pack 214 and the charge control of the battery pack 214, techniques carried out in notebook personal computers can be applied and the description of these techniques is omitted because they are well-known techniques.

In the hinge unit 130 shown in the lower part of FIG. 15, a hinge unit circuit board 231 connected to the bus 220 is shown in addition to the one-touch button 131, the hinge unit open/close detection switch 133 and the keyboard detection switch 151. This hinge unit circuit board 231 plays a role in operating the one-touch button 131 and in detecting the on/off condition of the hinge unit open-close switch 133 and the keyboard detection switch 151 and transmitting the result of the detection to the CPU 201.

Figure 16:
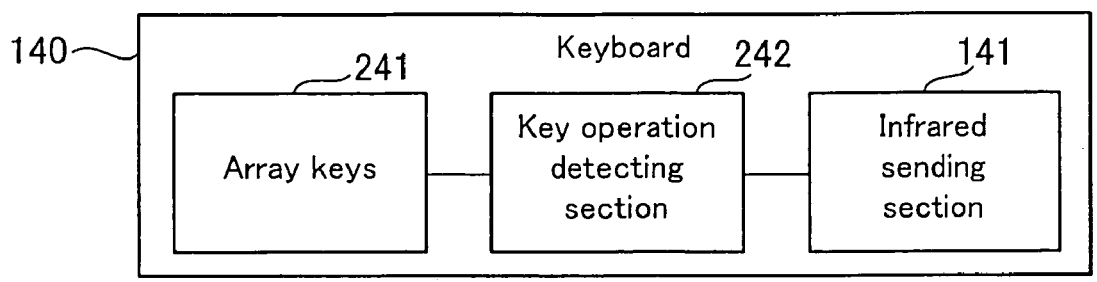
FIG. 16 is a circuit block diagram of a keyboard.

FIG. 16 is a circuit block diagram of the keyboard.

The keyboard 140 is provided with array keys 241 constituted by many arrayed keys, a key operation detection section 242 which detects the operation of these array keys 241, and an infrared sending section 141 which sends key operation information detected by the key operation detection section 242. As described earlier, the key operation information sent from this infrared sending section 141 is received by the infrared receiving section 128 (refer to FIG. 15) of the main body section 200 and transmitted to the CPU 201.

Figure 17:
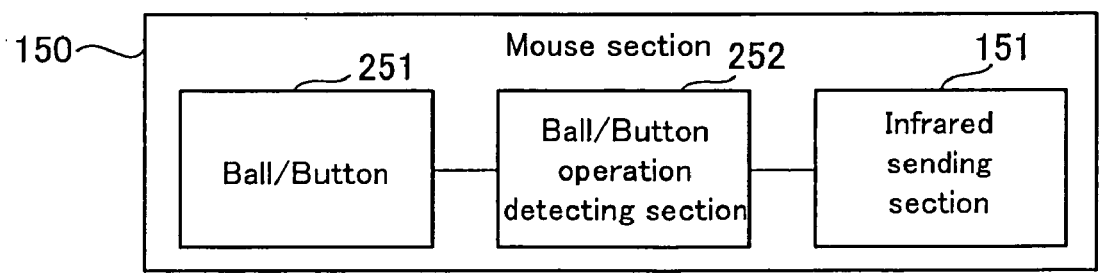
FIG. 17 is a circuit block diagram of a mouse.

FIG. 17 is a circuit block diagram of the mouse.

The mouse 150 is provided with a ball or a button 215 as an operating element, and the operation of the ball and the button is detected by a ball/button operation detecting section 252, and the mouse operation information detected by the ball/button operation detecting section 252 is sent from the infrared sending section 151. As described earlier, the mouse operation information sent from this infrared sending section 151 is received by the infrared receiving section 128 of the main frame section 200 (refer to FIG. 15) and transmitted to the CPU 201.

Figure 18:
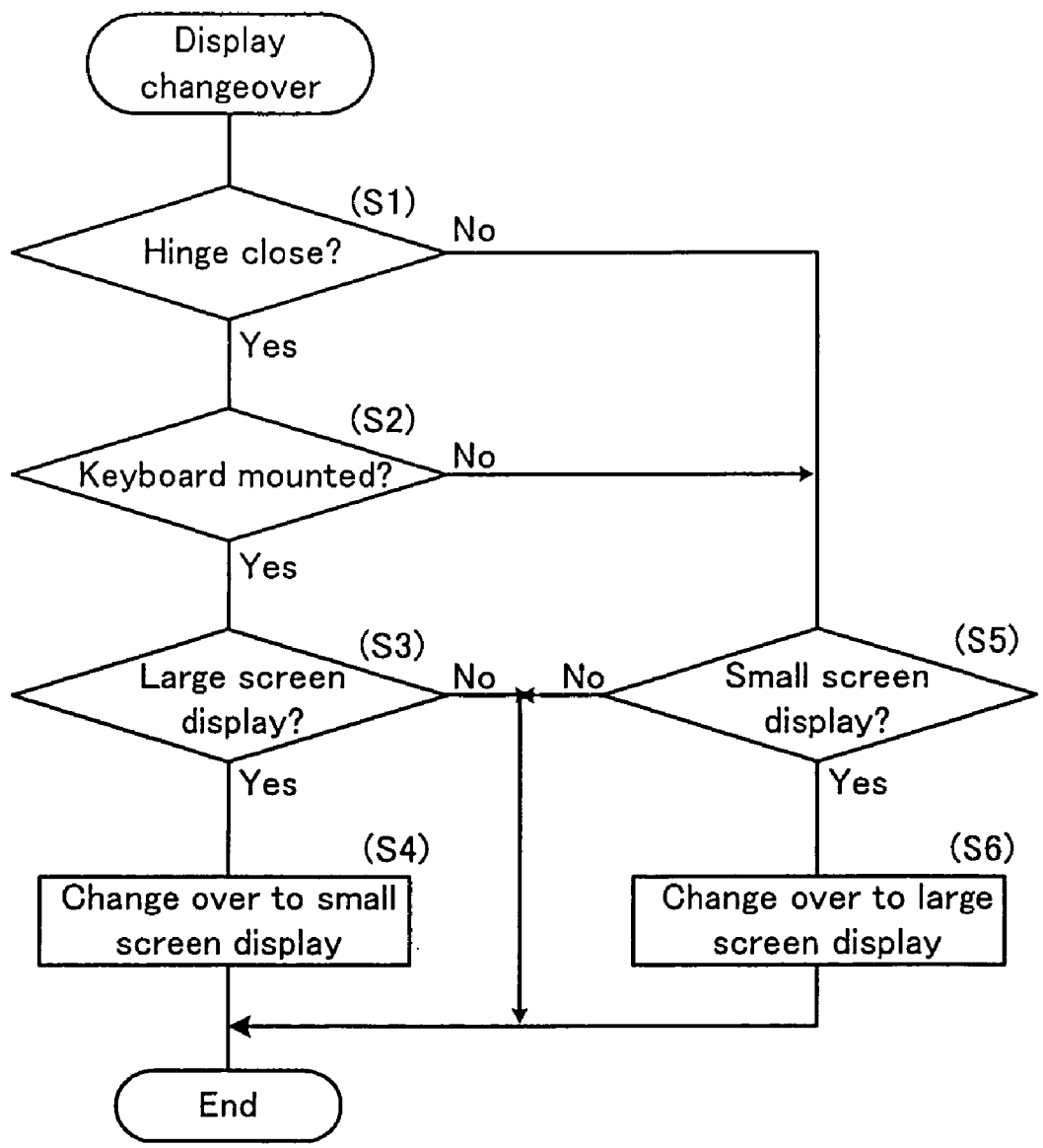
FIG. 18 is a flowchart of a display change over routine.

FIG. 18 is a flowchart of a display changeover routine.

This display changeover routine is an interruption routine which is executed by the CPU 201 of the main frame section 200 when the switch condition of any of the hinge unit open/close switch 133 and the keyboard detection switch 151 is changed from on to off or from off to on by the hinge unit circuit board 231.

When the display changeover routine of FIG. 18 is started, a judgment is passed as to whether or not the hinge unit 130 is in a closed condition (step S1) and whether or not the keyboard 140 has been mounted on the hinge unit 130 (step S2). When the hinge unit 130 is in a closed condition and the keyboard 140 has been mounted on the hinge unit 130 in the closed condition, i.e., in the state shown in FIG. 2, the processing proceeds to step S3, at which a judgment is passed as to whether the mode at present is a large screen display mode which performs screen display using the whole area of the liquid display screen 121. When the mode at present is a large screen display mode, the mode is changed over to a small screen display mode which displays, for example, a clock only in an upper part of the liquid crystal display screen 121 not covered with the keyboard 140 in the state shown in FIG. 2 (step S4).

In a case where it is judged at step S1 that the hinge unit is not in a closed condition or in a case where it is judged at step S2 that even when the hinge unit is in a closed condition, the keyboard has not been mounted on the hinge unit, the processing proceeds to step S5 because the whole area of the liquid crystal display screen 121 is in a visible condition, and when the mode at present is a small screen display mode, the mode is changed over to a large screen display mode.

As described above, the display modes are appropriately changed according to the on and off condition of both of the hinge unit open/close switch 133 and the keyboard detection switch 151.

The description of the integrated personal computer in one embodiment is completed. Next, embodiments as modifications to this embodiment will be described.

In the following description of embodiments, only points different from the above-described embodiment will be given.

In the above-described embodiment, the hinge unit 130 detached from the standing section 120 is shown in FIG. 4. This does not mean that in an ordinary use condition the hinge unit 130 is demounted from the standing section 120. This figure serves to illustrate the supporting shaft 129 which rotatably supports the hinge unit 130.

However, as a modification to the above-described embodiment, also this hinge unit 130 may be removably constructed with respect to the standing section 120 and at the same time, this hinge unit 130 may also be provided with an infrared sending section as with the keyboard 140 and the mouse 150 so that when the one-touch button 131 provided in the hinge unit 130 is operated, the operation information is sent from the infrared sending section to the infrared receiving section 128 of the main frame section 200 shown in FIG. 15 and the infrared receiving section 128 is caused to receive the operation information and transmit it to the CPU 201, which performs processing suited to the operation of the one-touch button 131.

Although in the above-described embodiment, infrared rays are used to send the key operation information of the keyboard 140 to the main frame section 200, other radio methods may be adopted. Also, key operation information may be transmitted by cable instead of radio communication by connecting the keyboard 140 and the main frame section 200 with cables.

In the above-described embodiment, the recess 143 is a concave portion. However, the recess 143 may be a through hole.

Figure 19:
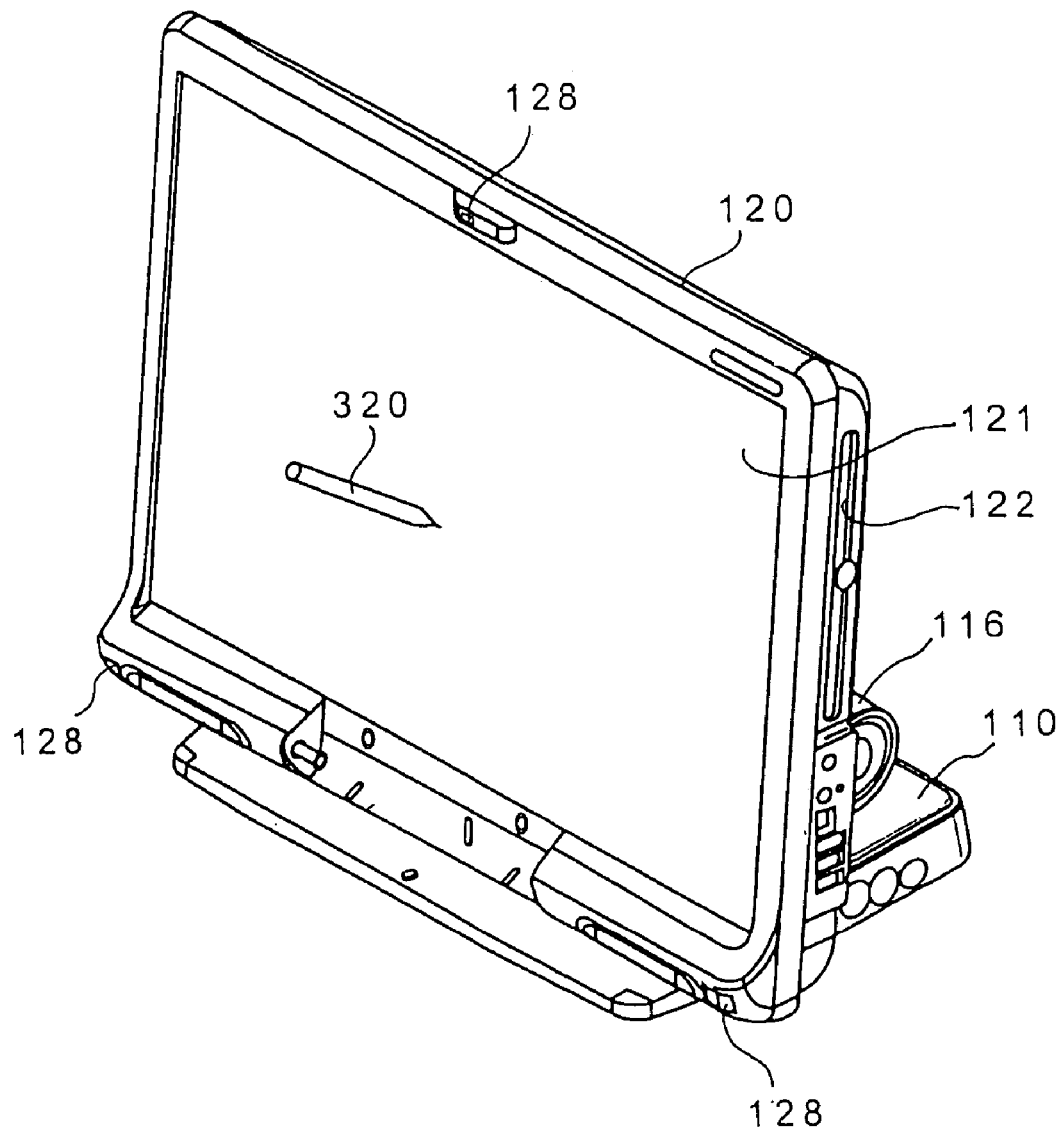
FIG. 19 is a diagram which shows a base section of an integrated personal computer and a standing section from which a hinge unit has been demounted.

FIG. 19 is a diagram which shows the base section 110 of an integrated personal computer 100 and the standing section 120 from which a hinge unit has been detached.

A touch pen 320 is also shown in FIG. 19. A touch pen may be provided in this manner, and instructions may be given to this integrated personal computer by touching the screen with the touch pen 320, with the keyboard and the hinge unit kept detached.

The above-described embodiments relate to an integrated personal computer. However, the present invention is not limited to an integrated personal computer and can be applied to various types of electronic apparatus in which part of their functional portions are removably constructed.

The invention claimed is:

1. An electronic apparatus which is provided with a first unit and a second unit having a unit mounting section where the first unit is removably mounted, and in which an electronic circuit is incorporated, wherein:

the first unit has an engagement recess in a portion to be attached to the unit mounting section, and the unit mounting section comprises:

an elastic locking section which is pushed by the first unit as the first unit moves in a mounting direction and is elastically deformed by the pushing of the first unit causing the elastic locking section to bend in a direction of an upper surface of the second unit and away from the first unit, and enters the engagement recess upon completion of the mounting thereby to lock the first unit, and which receives a movement operation in an operating direction intersecting the mounting direction when the first unit is caused to leave the unit mounting section; and a run-on section onto which the elastic locking section runs when the elastic locking section has received a movement operation in the operating direction thereby to elastically deform the elastic locking member and release the engagement recess from the engagement of the elastic locking section.

2. The electronic apparatus according to claim 1, wherein the unit mounting section is provided with an urging member which urges the elastic locking section in a direction reverse to the operating direction thereby to position the elastic locking section in a locking place where the first unit which has been mounted is locked.

3. The electronic apparatus according to claim 1, wherein the recess and the elastic locking section are provided in a plurality of pairs.

4. The electronic apparatus according to claim 1, wherein the electronic apparatus is provided with a shaft which extends in the operating direction, and wherein the elastic locking section comprises:

a claw section, which is positioned away from the shaft and ahead of the shaft in the mounting direction and protrudes to a position where the first unit enters the recess toward the recess in which the first unit has been mounted;

an elastic section which is positioned between the shaft and the claw and connects the shaft and the claw section together; and a run-on operating section which is provided adjacent to the claw section and runs onto the run-on section, and wherein the elastic section causes the claw section to elastically turn around the shaft.

5. The electronic apparatus according to claim 4, wherein the electronic apparatus is provided with an operating section which receives an operation and moves the shaft and the elastic locking section in the operating direction.

6. The electronic apparatus according to claim 4, wherein the unit mounting section is provided with an urging member which urges the shaft and the elastic locking section in a direction reverse to the operating direction thereby to position the shaft and the elastic locking section in a locking place where the first unit which has been mounted is locked.

7. The electronic apparatus according to claim 4, wherein the claw section has a tapered surface on both sides thereof ahead of and behind the mounting direction and a leading end of the claw section which enters the recess is formed in the shape of a spire.

8. The electronic apparatus according to claim 4, wherein the elastic locking section is provided integral with the shaft and in a plurality of numbers and the recess is provided in a plurality of numbers corresponding to the elastic locking sections.

9. The electronic apparatus according to claim 1, wherein the electronic apparatus is provided with a third unit and the second unit is a hinge unit which is rotatably connected to the third unit via a hinge, and wherein the first unit is releasably connected to the third unit, with the hinge unit interposed.

10. The electronic apparatus according to claim 9, wherein the first unit, the hinge unit and the third unit are each provided with a circuit part.

11. An electronic apparatus which is provided with a first unit and a second unit having a unit mounting section where the first unit is removably mounted, and in which an electronic circuit is incorporated, wherein:

the first unit has an engagement recess in a portion to be attached to the unit mounting section, and the unit mounting section comprises:

an elastic locking section which is pushed by the first unit that has moved in a mounting direction and elastically deformed, and enters the recess upon completion of the mounting thereby to lock the first unit, and which receives a movement operation in an operating direction intersecting the mounting direction when the first unit is caused to leave the unit mounting section; and a run-on section onto which the elastic locking section runs when the elastic locking section has received a movement operation in the operating direction thereby to elastically deform the elastic locking member and release the recess from the engagement of the elastic locking section, wherein the electronic apparatus is provided with a shaft which extends in the operating direction, and wherein the elastic locking section comprises:

a claw section, which is positioned away from the shaft and ahead of the shaft in the mounting direction and protrudes to a position where the first unit enters the recess toward the recess in which the first unit has been mounted;

an elastic section which is positioned between the shaft and the claw and connects the shaft and the claw section together; and a run-on operating section which is provided adjacent to the claw section and runs onto the run-on section, and wherein the elastic section causes the claw section to elastically turn around the shaft.

12. The electronic apparatus according to claim 11, wherein the electronic apparatus is provided with an operating section which receives an operation and moves the shaft and the elastic locking section in the operating direction.

13. The electronic apparatus according to claim 11, wherein the unit mounting section is provided with an urging member which urges the shaft and the elastic locking section in a direction reverse to the operating direction thereby to position the shaft and the elastic locking section in a locking place where the first unit which has been mounted is locked.

14. The electronic apparatus according to claim 11, wherein the claw section has a tapered surface on both sides thereof ahead of and behind the mounting direction and a leading end of the claw section which enters the recess is formed in the shape of a spire.

15. The electronic apparatus according to claim 11, wherein the elastic locking section is provided integral with the shaft and in a plurality of numbers and the recess is provided in a plurality of numbers corresponding to the elastic locking sections.

* * * * *